(12) United States Patent
Ishikawa et al.

(10) Patent No.: US 6,953,539 B2
(45) Date of Patent: Oct. 11, 2005

(54) COMPOSITE MATERIAL

(75) Inventors: Shuhei Ishikawa, Handa (JP); Tsutomu Mitsui, Chita-Gun (JP); Ken Suzuki, Handa (JP); Nobuaki Nakayama, Tokai (JP); Hiroyuki Takeuchi, Handa (JP); Seiji Yasui, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 296 days.

(21) Appl. No.: 10/245,999

(22) Filed: Sep. 18, 2002

(65) Prior Publication Data
US 2003/0054188 A1 Mar. 20, 2003

(30) Foreign Application Priority Data

Sep. 19, 2001 (JP) ........................................ 2001-285265
Aug. 26, 2002 (JP) ........................................ 2002-245820

(51) Int. Cl.$^7$ ....................... H01L 23/373; H01L 23/15; C04B 41/88; C22C 9/00
(52) U.S. Cl. ............................. 252/519.1; 428/307.7; 428/312.8; 428/313.9; 428/472; 423/290; 423/291; 423/345; 423/439; 501/88; 501/92; 420/469
(58) Field of Search .................. 252/519.1; 428/307.7, 428/312.8, 472, 312.6; 420/469; 423/290, 291, 345, 439, 313.9; 501/88, 92

(56) References Cited

U.S. PATENT DOCUMENTS 5,595,622 A * 1/1997 Pyzik et al. ............. 156/89.28

6,110,577 A * 8/2000 Ishikawa et al. ......... 428/307.7
6,183,874 B1 * 2/2001 Yamagata et al. ........... 428/472

FOREIGN PATENT DOCUMENTS

| EP | 501539 A2 | * | 9/1992 | ............. C22C/1/10 |
| JP | 59-228742 A | | 12/1984 | |
| JP | 04-097975 | * | 3/1992 | ........... C04B/41/88 |
| JP | 8-279569 A | | 10/1996 | |
| JP | P2000-174183 A | | 6/2000 | |
| JP | 2000-174183 | * | 6/2000 | ......... H01L/23/373 |
| WO | WO 01/34535 A1 | * | 5/2001 | ........... C04B/41/88 |

OTHER PUBLICATIONS

U.S. Appl. No. 09/913,353, filed Aug. 13, 2001, Ishikawa et al.

* cited by examiner

Primary Examiner—Mark Kopec
Assistant Examiner—Kallambella Vijayakumar
(74) Attorney, Agent, or Firm—Burr & Brown

(57) ABSTRACT

A composite material includes an SiC porous ceramic sintered body, which is formed by preliminarily sintering a porous body, having a coefficient of thermal expansion lower than the coefficient of thermal expansion of copper to construct a network therein. A copper alloy impregnating the porous ceramic sintered body includes copper and one or more additive elements which are prepared to impart a coefficient of thermal conductivity of 160 W/mK or higher to the composite material. The additive elements include up to 5% of at least one element selected from Be, Al, Si, Mg, Ti, Ni, Bi, Te, Zn, Pb, Sn, and mish metal, and also contain unavoidable impurities and gas components.

8 Claims, 27 Drawing Sheets

FIG. 3

| EXAMPLE | IMPREGNATING MATERIAL | POROSITY (vol%) | PORE DIAMETER (μm) | DISTRIBUTION FROM 5 TO 50 μm (%) | COEFFICIENT OF THERMAL CONDUCTIVITY (W/Mk) | COEFFICIENT OF THERMAL EXPANSION ($\times 10^{-6}$/°C) | POROUS BODY |
|---|---|---|---|---|---|---|---|
| INVENTIVE EXAMPLE 1 | COPPER | 30.9 | 46.4 | 90 | 222 | 4.56 | SiC |
| INVENTIVE EXAMPLE 2 | COPPER | 27.5 | 20.2 | 97 | 212 | 4.19 | SiC |
| INVENTIVE EXAMPLE 3 | COPPER | 24.0 | 14.8 | 97 | 193 | 4.49 | SiC |
| INVENTIVE EXAMPLE 4 | COPPER | 39.4 | 38.5 | 92 | 245 | 5.9 | SiC |
| INVENTIVE EXAMPLE 5 | COPPER | 39.7 | 24.2 | 97 | 246 | 6.2 | SiC |
| INVENTIVE EXAMPLE 6 | COPPER | 49.1 | 28.0 | 93 | 268 | 6.8 | SiC |
| INVENTIVE EXAMPLE 7 | COPPER | 62 | 6.5 | 99 | 298 | 7.5 | SiC |
| INVENTIVE EXAMPLE 8 | COPPER | 63 | 37 | 92 | 299 | 8.8 | SiC |
| INVENTIVE EXAMPLE 9 | COPPER Be 0.5wt% | 30.9 | 10.1 | 99 | 220 | 4.19 | SiC |
| COMPARATIVE EXAMPLE 1 | COPPER | 14 | 25 | 98 | 165 | 4.0 | SiC |
| COMPARATIVE EXAMPLE 2 | COPPER | 80 | 40 | 88 | 325 | 12.4 | SiC |
| COMPARATIVE EXAMPLE 3 | COPPER | 50 | 150 | 75 | 261 | 9.1 | SiC |

COEFFICIENT OF THERMAL EXPANSION: AVERAGE VALUE FROM ROOM TEMPERATURE TO 200°C

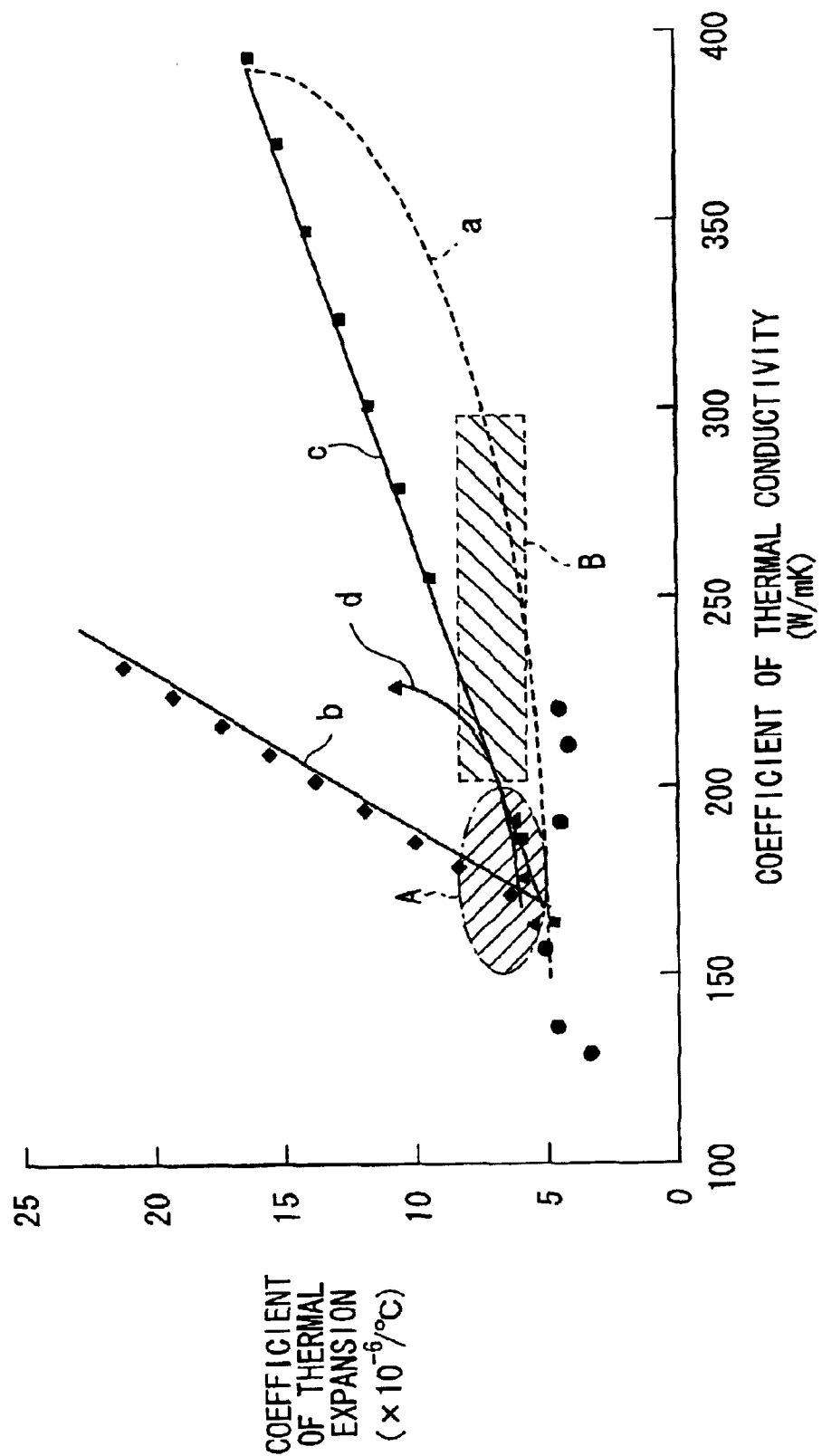

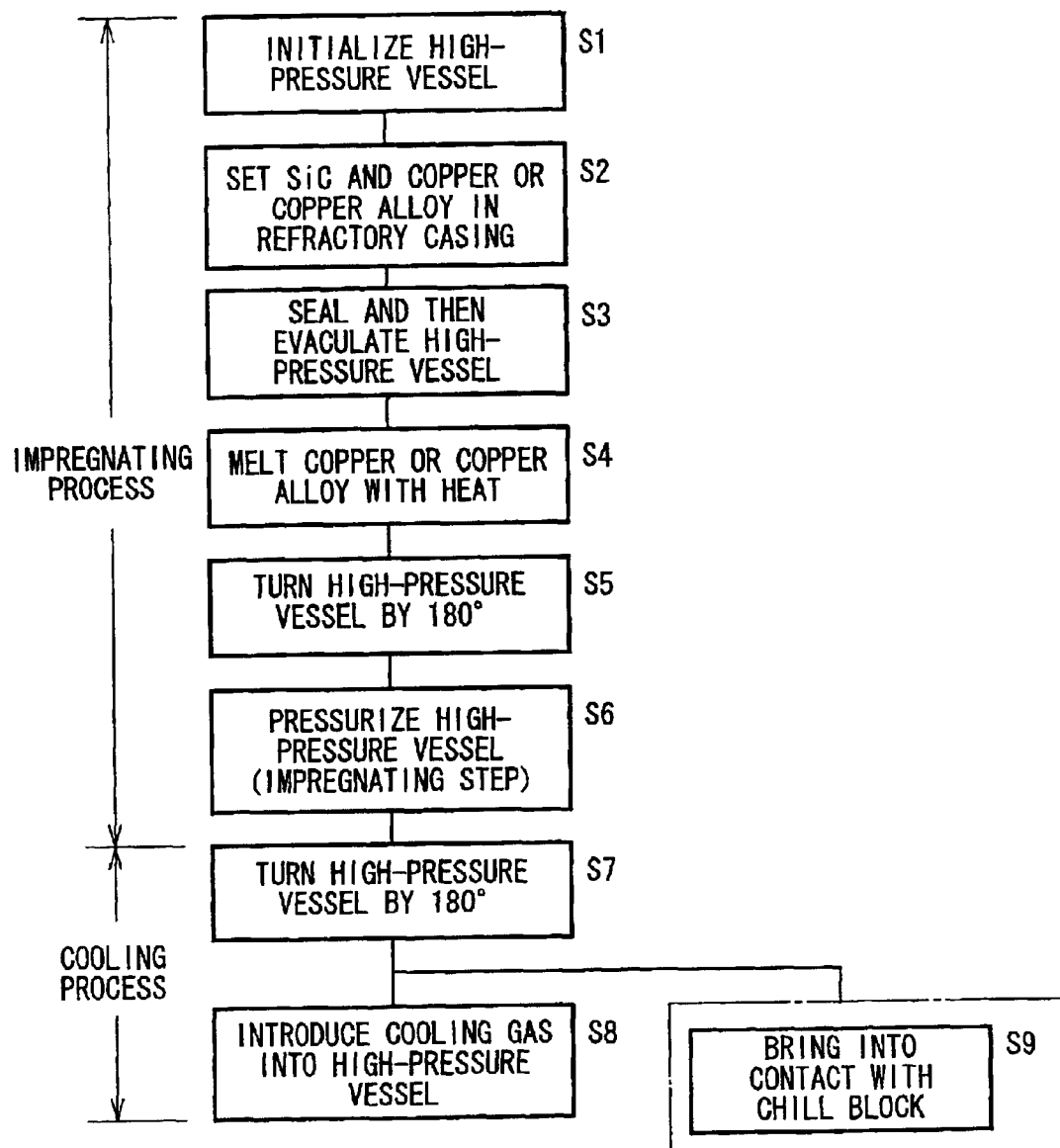

FIG. 7

| No. | POROSITY (%) | PORE DIAMETER (μm) | Ni PLATING | Si IMPREGNATION | IMPREGNATING TEMPERATURE (°C) | PRESSURE (kgf/cm2) | PRESSURIZING TIME (sec) | COOLING RATE (°C/min) | REACTION BETWEEN SiC AND Cu | IMPREGNATED STATE |
|---|---|---|---|---|---|---|---|---|---|---|
| SAMPLE 1 | 35 | 70 | NO | NO | 1130 | 8 | 60 | 260 | △ | △ |
| SAMPLE 2 | 44 | 22 | NO | NO | 1130 | 80 | 20 | 900 | ○ | ◎ |
| SAMPLE 3 | 59 | 42 | NO | YES | 1130 | 120 | 10 | 480 | ◎ | ◎ |
| SAMPLE 4 | 15 | 5 | YES | NO | 1130 | 240 | 10 | 900 | ◎ | ○ |
| SAMPLE 5 | 59 | 42 | NO | YES | 1180 | 8 | 60 | 900 | △ | △ |
| SAMPLE 6 | 15 | 5 | NO | NO | 1180 | 40 | 20 | 480 | ○ | △ |
| SAMPLE 7 | 59 | 42 | NO | YES | 1180 | 120 | 10 | 900 | ◎ | ◎ |
| SAMPLE 8 | 44 | 22 | NO | NO | 1180 | 240 | 10 | 620 | ◎ | ◎ |
| SAMPLE 9 | 44 | 22 | NO | YES | 1230 | 8 | 20 | 480 | ○ | △ |
| SAMPLE 10 | 59 | 42 | YES | NO | 1230 | 40 | 35 | 790 | ○ | ○ |
| SAMPLE 11 | 35 | 70 | YES | NO | 1230 | 80 | 10 | 620 | ◎ | ◎ |
| SAMPLE 12 | 44 | 22 | NO | YES | 1230 | 240 | 5 | 620 | ◎ | ◎ |
| SAMPLE 13 | 59 | 42 | NO | NO | 1280 | 40 | 5 | 790 | ○ | ○ |
| SAMPLE 14 | 35 | 70 | YES | NO | 1280 | 80 | 35 | 480 | △ | ◎ |
| SAMPLE 15 | 44 | 22 | YES | NO | 1280 | 80 | 5 | 620 | ○ | ◎ |
| SAMPLE 16 | 59 | 42 | NO | YES | 1280 | 120 | 10 | 790 | ○ | ◎ |

NOTE) REACTION BETWEEN SiC AND Cu: ◎NO REACTION ○LOW REACTION △HIGH REACTION
IMPREGNATED STATE: ◎WELL IMPREGNATED ○IMPREGNATED SLIGHTLY INSUFFICIENTLY
△IMPREGNATED INSUFFICIENTLY

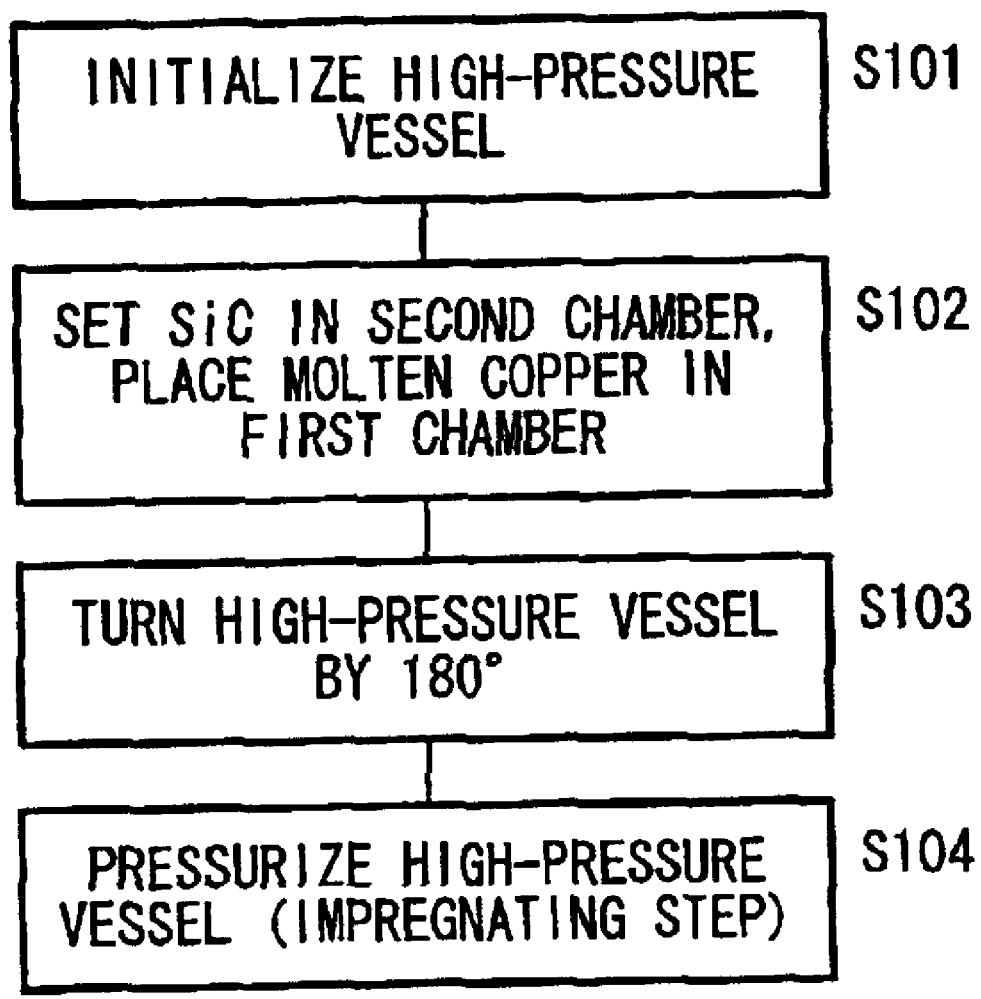

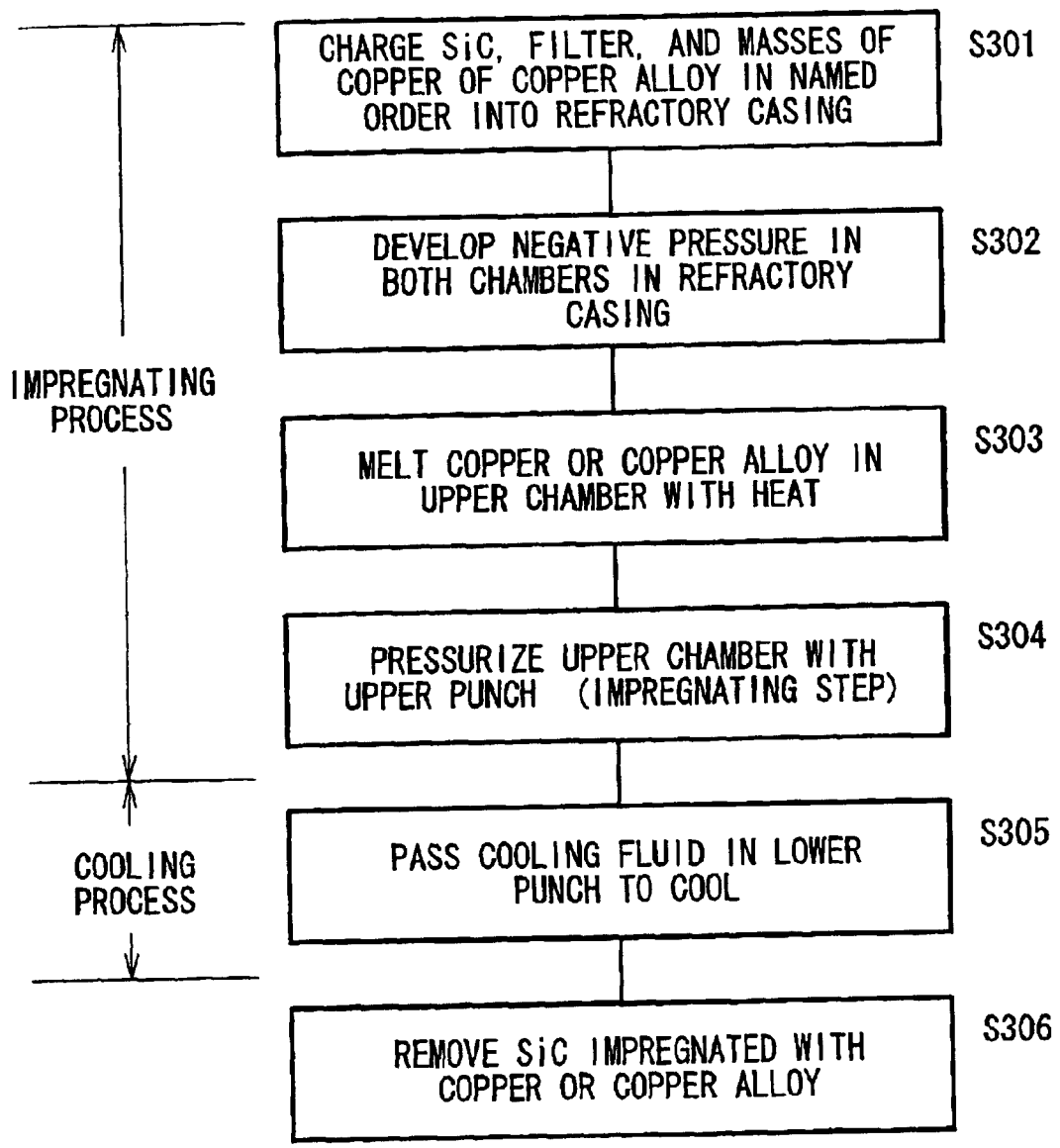

FIG. 18

| | IMPREGNATING METAL | NO. OF MEASUREMENTS (COUNT) | AVERAGE VALUE (W/mk) | VARIATION |
|---|---|---|---|---|
| INVENTIVE EXAMPLE 11 | Cu | 17 | 157 | 14.2 |
| INVENTIVE EXAMPLE 12 | Cu-2%Be | 26 | 200 | 10.3 |
| INVENTIVE EXAMPLE 13 | Cu-2%Ti | 4 | 195 | 11.5 |
| INVENTIVE EXAMPLE 14 | Cu-1.5%Si | 6 | 205 | 12 |

FIG. 19

| | IMPREGNATING METAL | NO. OF MEASUREMENTS (COUNT) | AVERAGE VALUE (W/mk) | VARIATION |
|---|---|---|---|---|
| INVENTIVE EXAMPLE 21 | Cu | 7 | 145 | 15.3 |
| INVENTIVE EXAMPLE 22 | Cu-2%Be | 6 | 215 | 9.8 |
| INVENTIVE EXAMPLE 23 | Cu-2%Ti | 3 | 206 | 10.8 |
| INVENTIVE EXAMPLE 24 | Cu-1.5%Si | 3 | 216 | 12.3 |

FIG. 20

| | IMPREGNATING METAL | COOLING PROCESS | NO. OF MEASUREMENTS (COUNT) | AVERAGE VALUE (W/mk) | VARIATION |
|---|---|---|---|---|---|
| INVENTIVE EXAMPLE 31 | Cu | INDIRECT WATER-COOLED COIL | 6 | 145 | 35.2 |
| INVENTIVE EXAMPLE 32 | Cu | CHILL PLATE | 5 | 165 | 18.5 |
| INVENTIVE EXAMPLE 33 | Cu | DIRECT GAS COOLING | 6 | 172 | 10.4 |

FIG. 23A

| | PURE COPPER | Be | Bi | Cr | MM | Mn | Nb | Ni |
|---|---|---|---|---|---|---|---|---|
| ADDED AMOUNT [wt%] | | 0.5-1.0 | 0.2-2.0 | 0.5 | 0.5 | 1.0 | 1.0 | 0.5-3.0 |
| COEFFICIENT OF THERMAL CONDUCTIVITY MAX [W/mK] | 191 | 226 | 219 | 184 | 195 | 189 | 190 | 222 |
| COEFFICIENT OF THERMAL CONDUCTIVITY AVE [W/mK] | 169 | 191 | 200 | 181 | 192 | 187 | 187 | 193 |
| COEFFICIENT OF THERMAL CONDUCTIVITY min [W/mK] | 156 | 166 | 171 | 179 | 190 | 185 | 184 | 159 |

FIG. 23B

| | Sb | TeBi | TeNi | Te | TeCa | TeCr | TeFe | TeMg |
|---|---|---|---|---|---|---|---|---|
| ADDED AMOUNT [wt%] | 0.5 | 0.2-2.0/0.2-2.0 | 0.2-2.0/0.2-2.0 | 0.2-2.0 | 0.2-2.0/0.2-2.0 | 0.2-2.0/0.2-2.0 | 0.2-2.0/0.2-2.0 | 0.2-2.0/0.2-2.0 |
| COEFFICIENT OF THERMAL CONDUCTIVITY MAX [W/mK] | 177 | 226 | 182 | 242 | 213 | 200 | 201 | 205 |
| COEFFICIENT OF THERMAL CONDUCTIVITY AVE [W/mK] | 175 | 224 | 180 | 205 | 197 | 174 | 179 | 190 |
| COEFFICIENT OF THERMAL CONDUCTIVITY min [W/mK] | 173 | 222 | 178 | 170 | 184 | 150 | 152 | 164 |

FIG. 23C

| | TeMM | TePb | TeSn | TeZr | Ti | Zr |
|---|---|---|---|---|---|---|
| ADDED AMOUNT [wt%] | 0.2-2.0/0.2-2.0 | 0.2-2.0/0.2-2.0 | 0.2-2.0/0.2-2.0 | 0.2-2.0/0.2-2.0 | 1.5 | 1.3 |
| COEFFICIENT OF THERMAL CONDUCTIVITY MAX [W/mK] | 219 | 218 | 206 | 210 | 204 | 193 |
| COEFFICIENT OF THERMAL CONDUCTIVITY AVE [W/mK] | 206 | 216 | 203 | 201 | 201 | 191 |
| COEFFICIENT OF THERMAL CONDUCTIVITY min [W/mK] | 194 | 215 | 201 | 191 | 200 | 189 |

FIG. 24A

| | PURE COPPER | Ag | Al | Be | Bi | Ca | Co | Cr |
|---|---|---|---|---|---|---|---|---|
| ADDED AMOUNT [wt%] | | 0.8 | 4.6 | 0.5-1.0 | 1.0-2.0 | 2.3 | 9.0 | 3.6 |
| COEFFICIENT OF THERMAL CONDUCTIVITY MAX [W/mK] | 131 | 124 | 124 | 197 | 168 | 116 | 107 | 159 |
| COEFFICIENT OF THERMAL CONDUCTIVITY AVE [W/mK] | 123 | 122 | 122 | 165 | 126 | 114 | 105 | 138 |
| COEFFICIENT OF THERMAL CONDUCTIVITY min [W/mK] | 115 | 119 | 120 | 119 | 104 | 112 | 104 | 116 |

FIG. 24B

| | Fe | Mg | MM | Mn | Nb | Ni | Pb | Sb |
|---|---|---|---|---|---|---|---|---|
| ADDED AMOUNT [wt%] | 1.9 | 1.0-2.0 | 0.5-0.7 | 1.0 | 1.0 | 0.5-3.0 | 1.0 | 0.5 |
| COEFFICIENT OF THERMAL CONDUCTIVITY MAX [W/mK] | 130 | 122 | 115 | 137 | 138 | 170 | 107 | 154 |
| COEFFICIENT OF THERMAL CONDUCTIVITY AVE [W/mK] | 127 | 118 | 113 | 135 | 115 | 144 | 105 | 152 |
| COEFFICIENT OF THERMAL CONDUCTIVITY min [W/mK] | 125 | 115 | 108 | 133 | 92 | 114 | 104 | 150 |

FIG. 24C

| | Sn | Te | TeBi | TeNi | TePb | Ti | Zr |
|---|---|---|---|---|---|---|---|
| ADDED AMOUNT [wt%] | 1.0 | 0.5-2.0 | 0.2-2.0/0.2-2.0 | 0.2-2.0/0.2-2.0 | 0.2-2.0/0.2-2.0 | 1.5 | 0.5-9.7 |
| COEFFICIENT OF THERMAL CONDUCTIVITY MAX [W/mK] | 117 | 184 | 172 | 148 | 178 | 130 | 161 |
| COEFFICIENT OF THERMAL CONDUCTIVITY AVE [W/mK] | 115 | 155 | 170 | 146 | 177 | 128 | 123 |
| COEFFICIENT OF THERMAL CONDUCTIVITY min [W/mK] | 114 | 112 | 169 | 143 | 175 | 126 | 107 |

COMPOSITE MATERIAL

BACKGROUND OF THE INVENTION

1. Field of the Invention

The present invention relates to a composite material having an inorganic material or an oxide film thereof which is impregnated with a metal, and more particularly to a composite material for use in a heat sink such as a semiconductor heat sink for efficiently radiating heat generated by a semiconductor device, for example.

2. Description of the Related Art

Generally, semiconductor devices are highly susceptible to heat, and should be designed such that their internal temperature will not exceed an allowable maximum temperature at a junction area of said semiconductor devices. Semiconductor devices such as power transistors and semiconductor rectifiers consume a large amount of electric power per operating area, and cases (packages) and leads of such semiconductor devices may not be effective enough to sufficiently radiate heat generated thereby. Therefore, the internal temperature of those semiconductor devices tend to increase to such a level that the semiconductor devices may suffer a thermal breakdown.

The above phenomenon also occurs in semiconductor devices incorporating CPUs. As the clock frequency of the CPU increases, the semiconductor device generates more heat while in operation. It is important to design semiconductor devices to incorporate a thermally designed heat radiation structure.

Thermal designs for protecting semiconductor devices against a thermal breakdown include device designs and mount designs which include heat sinks having a large heat radiating area and fixed to semiconductor device cases (packages).

The heat sinks are generally made of metal such as copper, aluminum, or the like that has good thermal conductivity.

Recently, semiconductor devices such as CPUs, memories, etc. tend to be larger in size because of higher integration of semiconductors and greater areas taken up by semiconductors, while at the same time seeking a low power drive mode for low power consumption. Semiconductor devices of greater size are liable to peel off position or be mechanically broken due to increased stresses which are caused by the difference between the coefficient of thermal expansion of the semiconductor substrate (silicon substrate or GaAs substrate) and the coefficient of thermal expansion of the heat sink.

Possible approaches to the prevention of the above drawbacks include a low power drive mode for semiconductor devices and an improvement of heat sink materials. At present, a practical low power drive mode for semiconductor devices has a power supply voltage of 3.3 V rather than the conventional TTL level (5 V).

As for heat sink materials, thermal conductivity is not the only factor to be taken into consideration for their selection, but it has become necessary to select heat sink materials which have a coefficient of thermal expansion that is substantially the same as the coefficient of thermal expansion of silicon and GaAs which the semiconductor substrate is made of, and also have high thermal conductivity.

Various reports have been made with respect to improved heat sink materials. For example, proposed examples of heat sink materials include aluminum nitride (AlN) and Cu—W (copper-tungsten). AlN is suitable for use as a heat sink material for semiconductor devices which use a silicon substrate because it has a coefficient of thermal conductivity and a coefficient of thermal expansion well balanced and particularly because its coefficient of thermal expansion is substantially the same as the coefficient of thermal expansion of Si.

Cu—W is suitable for use as a material of a heat sink which has a complex shape because it is a composite material having a low coefficient of thermal expansion provided by W and a high coefficient of thermal conductivity provided by Cu, and it is easily machinable.

Other examples of heat sink materials include a ceramic base material mainly composed of SiC and containing 20 vol. % to 40 vol. % of Cu (conventional example 1: Japanese laid-open patent publication No. 8-279569) and a powder-sintered porous body of an inorganic material impregnated with 5 wt. % to 30 wt. % of Cu (conventional example 2: Japanese laid-open patent publication No. 59-228742).

The heat sink material according to the conventional example 1 is formed by powder molding such that the heat sink material is molded as a compressed powder of SiC and Cu into a heat sink. The coefficient of thermal expansion and the coefficient of thermal conductivity of the heat sink material are of theoretical values. Therefore, the theoretical values cannot be balanced against the coefficient of thermal expansion and the coefficient of thermal conductivity of actual electronic parts.

The heat sink material according to the conventional example 2 suffers a limitation on efforts to increase the coefficient of thermal conductivity as the ratio of Cu impregnated in the powder-sintered porous body is low.

SUMMARY OF THE INVENTION

It is therefore an object of the present invention to provide a composite material having characteristics balanced against the coefficient of thermal expansion and the coefficient of thermal conductivity of actual electronic parts (including semiconductor devices).

Another object of the present invention is to provide a composite material which can increase an impregnation ratio of a metal to a porous ceramic sintered body resulting in the metal being easily impregnated into the porous ceramic sintered body, which can increase the productivity of a heat sink having characteristics balanced against the coefficient of thermal expansion and the coefficient of thermal conductivity of actual electronic parts (including semiconductor devices).

Still another object of the present invention is to provide a composite material which has an oxide film formed on the surface of a porous ceramic sintered body and impregnated with a metal, for thereby increasing the productivity of a heat sink having characteristics balanced against the coefficient of thermal expansion and the coefficient of thermal conductivity of actual electronic parts (including semiconductor devices).

Yet another object of the present invention is to provide a composite material which has increased lubricity and can be used as a sliding material and a bearing material.

Optimum characteristics which heat sink materials should have are described below. The coefficient of thermal expansion of the heat sink material should preferably be in the range from $4.0 \times 10^{-6}/°$ C. to $9.0 \times 10^{-6}/°$ C. at a temperature ranging from the room temperature to 200° C., because of the need for matching the coefficient of thermal expansion of a ceramic substrate such as of AlN or the like or a semiconductor substrate such as of Si, GaAs, or the like. The coefficient of thermal conductivity of the heat sink material should preferably be 160 W/mK (at the room temperature) or higher because of the need for satisfying the requirement of the presently used Cu—W material.

In order to obtain the above characteristics, a composite material according to the present invention comprises a porous ceramic sintered body produced by preliminarily sintering a porous body having a coefficient of thermal expansion lower than the coefficient of thermal expansion of copper to construct a network therein, and a copper alloy impregnated in the porous ceramic sintered body. The copper alloy includes copper and one or more additive elements which are prepared to impart a coefficient of thermal conductivity of 160 W/mK or higher to the composite material.

With the above arrangement, the coefficient of thermal expansion of the composite material can be held to a value lower than a coefficient of thermal expansion (theoretical value) that is determined by the ratio between the porous ceramic sintered body and the copper alloy impregnated in the porous ceramic sintered body. Since the coefficient of thermal expansion of the composite material is substantially the same as the coefficient of thermal expansion of a ceramic substrate or a semiconductor substrate (silicon, GaAs), the composite material serves as a heat sink material of good thermal conductivity.

Specifically, the heat sink material has an average coefficient of thermal expansion in the range from $4.0 \times 10^{-6}/°C$ to $9.0 \times 10^{-6}/°C$ at a temperature ranging from room temperature to 200° C. and a coefficient of thermal conductivity of 160 W/mK (at room temperature) or greater, or preferably 180 W/mK or greater.

Because the porous ceramic sintered body is impregnated with the copper alloy, the composite material exhibits high lubricity. In addition, since the specific resistance of the composite material is low, the composite material can be used as a sliding material, a bearing material, etc.

The additive elements should preferably comprise a material for increasing a solidification temperature range to 70° C. or higher and reducing a melting point when added to the copper.

If commercial pure copper is used as a metal to be impregnated in the porous ceramic sintered body, then though it has a high coefficient of thermal conductivity, its wettability with respect to the porous ceramic sintered body (particularly, SiC) is poor, tending to leave some open pores unimpregnated with pure copper in the porous ceramic sintered body. As a result, if the conditions such as the molten metal temperature, the pressurizing time, the cooling time, etc. at the time the porous ceramic sintered body is impregnated with the pure copper are varied, the coefficient of thermal conductivity is greatly changed, resulting in large variations of the characteristics of final products that are manufactured.

According to the present invention, the impregnation ratio is increased by adding the additive elements which comprises at least one of one or more carbide generating elements, one or more oxide generating elements, or one or more surface-active elements. Specifically, Be, Al, Si, Mg, Ti, Ni, or the like is added to copper. If the amount of the additive element is greater than 5%, then the coefficient of thermal conductivity is greatly reduced, failing to achieve the effect of the added element. Therefore, the copper alloy impregnated in the porous ceramic sintered body should preferably contain up to 5% of at least one selected from Be, Al, Si, Mg, Ti, Ni, Bi, Te, Zn, Pb, Sn, and mish metal added to the copper. Be and Te, in particular, are effective if added in the range from 0.01 to 3.0% and highly effective if added in the range from 0.01 to 2.0%.

The porous ceramic sintered body should preferably comprise a compound selected from the group consisting of SiC, AlN, $Si_3N_4$, $B_4C$, and BeO.

If the porous ceramic sintered body comprises SiC, then the SiC should preferably have a porosity ranging from 10 vol. % to 70 vol. %. Of the above additive elements, Be, Ti, and mish metal, for example, are effective to suppress a reaction between the SiC and the copper in the SiC because they react with the C of the SiC to form a stable carbide layer on the surface of the SiC.

Of the additive elements, Be, Mg, Ti, and mish metal, for example, are bonded to the oxygen of an oxide ($SiO_2$) on the surface of the SiC to form a stable oxide layer for suppressing the reaction between the SiC and the Cu within the SiC.

Of the additive elements, Si, Ni, Bi, Te, Zn, Pb, and Sn, for example, exhibit any one or a combination of the following effects (1) to (4):

(1) The above additive elements gather on the surface of the SiC to suppress the reaction between the SiC and the Cu;

(2) The above additive elements change the wettability between the SiC and the Cu to prevent them from reacting with each other;

(3) The above additive elements change the wettability between the SiC and the Cu to increase the impregnation ratio of the Cu; and/or (4) With a low-melting-point metal being added, the above additive elements prevent an interfacial peel-off between the SiC and the Cu after the Cu has been solidified.

Particularly, Te or a compound material containing Te is effective in increasing the coefficient of thermal conductivity.

According to the present invention, a composite material comprises a porous ceramic sintered body produced by preliminarily sintering a porous body having a coefficient of thermal expansion lower than the coefficient of thermal expansion of copper to construct a network therein, an oxide film formed on a surface of the porous ceramic sintered body, and a copper alloy impregnated in the oxide film. The copper alloy includes copper and one or more additive elements which are prepared to impart a coefficient of thermal conductivity of 200 W/mK or higher, or more preferably 220 W/mK, to the composite material.

The oxide film thus formed on the surface of the porous ceramic sintered body is able to suppress an interfacial reaction in the porous ceramic sintered body for thereby avoiding a reduction in the coefficient of thermal conductivity of the porous ceramic sintered body.

The additive elements should preferably comprise at least one of one or more oxide generating elements or one or more surface-active elements added to the copper. Specifically, the additive elements should comprise at least one element selected from the group consisting of Be, Ca, Mg, Ti, Zr, Bi, Ni, Te, and mish metal added to the copper. Of these materials, Be, Ca, Mg, Ti, Zr, and mish metal are oxide generating elements for promoting the generation of an oxide film, and Bi, Ni, and Te are surface-active elements for improving the wettability between the oxide film and the copper to allow the oxide film to be impregnated with the copper alloy easily.

The porous ceramic sintered body should preferably comprise at least one compound selected from the group consisting of SiC, AlN, $Si_3N_4$, $B_4C$, and BeO. Particularly, if the porous ceramic sintered body comprises SiC, then the SiC should preferably have a porosity ranging from 10 vol. % to 70 vol. %.

The thickness of the oxide film varies depending on the impregnating conditions under which the oxide film is impregnated with the copper alloy. The impregnating conditions determine the thickness of the oxide film which is optimum for the suppression of the interfacial reaction. The thickness of the oxide film should preferably be in the range from 0.01 μm to 10 μm. If the thickness of the oxide film is too large, then the oxide film acts as a thermal barrier between the porous ceramic sintered body and the copper alloy, tending to lower the coefficient of thermal conductivity of the composite material according to the present invention.

The above impregnating conditions include the molten temperature of the copper alloy to be impregnated in the oxide film, the contact time in which the oxide film contacts the copper alloy, the cooling process selected to cool the porous ceramic sintered body after the oxide film is impregnated with the copper alloy, and the additive element or elements contained in the copper alloy and the amount of the additive element or elements.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 3 is a table showing the results of an experiment which indicates how a coefficient of thermal conductivity and a coefficient of thermal expansion differ when the porosity, the pore diameter, and the pore distribution of SiC are changed;

FIG. 4 is a diagram showing coefficient of thermal conductivity vs. coefficient of thermal expansion characteristics of various composite materials;

FIG. 6 is a flowchart of a method of manufacturing the composite material according to the first embodiment;

FIG. 7 is a table showing how the reaction of SiC and Cu and an impregnated state of Cu differ when the porosity and pore diameter of SiC, the impregnating temperature, the pressure, the pressurizing time, and the cooling rate are changed, and depending on whether Ni is plated or not and Si is impregnated or not;

FIG. 8 is a flowchart of an impregnating process according to a first modification;

FIG. 11 is a flowchart of the method of manufacturing the composite material according to the second embodiment;

FIG. 18 is a table showing the results of a first experiment, indicating different coefficients of thermal conductivity for different metals impregnated in SiC;

FIG. 19 is a table showing the results of a second experiment, indicating different coefficients of thermal conductivity for different metals impregnated in AlN;

FIG. 20 is a table showing the results of a third experiment, indicating different coefficients of thermal conductivity for different cooling processes with pure copper impregnated in SiC;

FIG. 23A is a table showing different coefficients of thermal conductivity for different additive elements contained in a copper alloy impregnated in SiC having a porosity of 20 vol. %;

FIG. 23B is a table showing different coefficients of thermal conductivity for different additive elements contained in a copper alloy impregnated in SiC having a porosity of 20 vol. %;

FIG. 23C is a table showing different coefficients of thermal conductivity for different additive elements contained in a copper alloy impregnated in SiC having a porosity of 20 vol. %;

FIG. 24A is a table showing different coefficients of thermal conductivity for different additive elements contained in a copper alloy impregnated in SiC having a porosity of 30 vol. %;

FIG. 24B is a table showing different coefficients of thermal conductivity for different additive elements contained in a copper alloy impregnated in SiC having a porosity of 30 vol. %;

FIG. 24C is a table showing different coefficients of thermal conductivity for different additive elements contained in a copper alloy impregnated in SiC having a porosity of 30 vol. %;

DETAILED DESCRIPTION OF THE INVENTION

Figure 1:
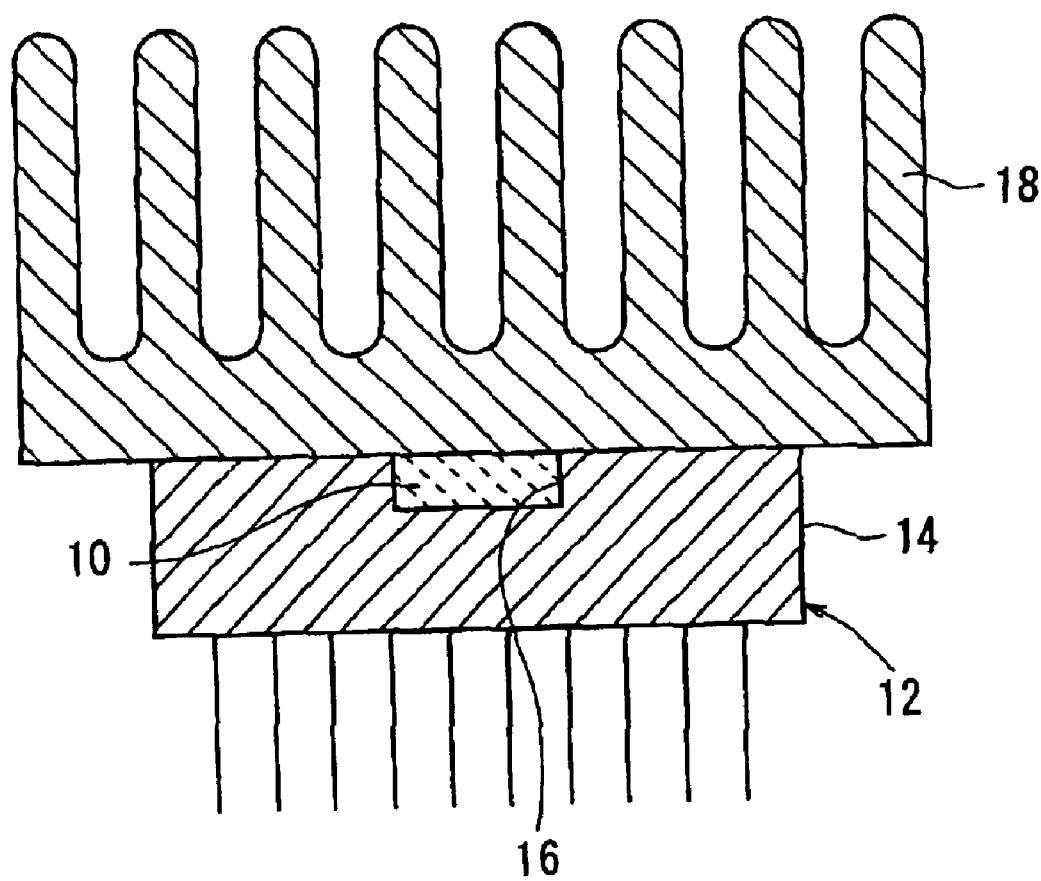
FIG. 1 is a cross-sectional view of a heat sink used in an application, which is made of a composite material according to a first embodiment of the present invention.

As shown in FIG. 1, a heat sink 10 made of a composite material according to a first embodiment of the present invention is embedded in an opening 16 defined in an upper surface of a package 14 of a semiconductor device 12 and has a surface held in contact with cooling fins 18 fixed to the upper surface of the package 14.

Heat radiated from a semiconductor element (chip) mounted in the semiconductor device 12 is efficiently transferred through the heat sink 10 to the cooling fins 18.

Figure 2:
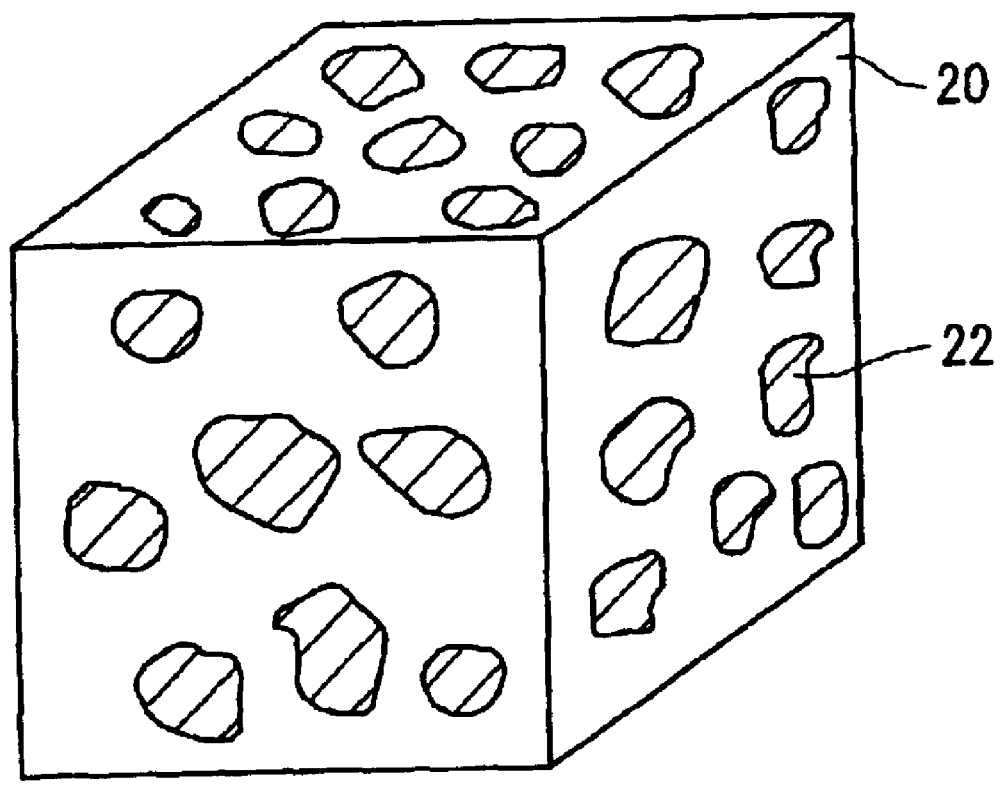
FIG. 2 is a perspective view showing a conceptual representation of the composite material according to the first embodiment.

The composite material according to the first embodiment of the present invention comprises a porous ceramic sintered body produced by preliminarily sintering a porous body having a coefficient of thermal expansion lower than the coefficient of thermal expansion of copper to construct a network therein, the porous ceramic sintered body being impregnated with a copper alloy. Specifically, as shown in FIG. 2, a porous ceramic sintered body 20 of SiC has open pores impregnated with a copper alloy 22. The porous ceramic sintered body 20 of SiC will hereinafter be referred to as "SiC 20".

With the above structure, as described later on, the composite material has a coefficient of thermal expansion held to a value lower than the coefficient of thermal expansion (theoretical value) that is determined by the ratio between the SiC 20 and the copper alloy 22 impregnated in the SiC 20. Since the coefficient of thermal expansion of the composite material is substantially the same as the coefficient of thermal expansion of a ceramic substrate or a semiconductor substrate (silicon, GaAs) which serves as a base for electronic parts or the like, the composite material serves as a heat sink material of good thermal conductivity. Specifically, the heat sink material has an average coefficient of thermal expansion in the range from $4.0 \times 10^{-6}/°$ C. to $9.0 \times 10^{-6}/°$ C. at a temperature ranging from room temperature to 200° C. and a coefficient of thermal conductivity of 160 W/mK (at room temperature) or greater.

The SiC 20 should preferably have a porosity in the range from 10 vol. % to 70 vol. %, which is substantially the same as the impregnation ratio of the copper alloy 22. If the porosity of the SiC 20 were less than 10 vol. %, then the heat sink material would not have a coefficient of thermal conductivity of 180 W/mK (at room temperature). If the porosity of the SiC 20 were greater than 70 vol. %, then the mechanical strength of the SiC 20 would be lowered, and the coefficient of thermal expansion thereof would not be reduced to less than $9.0 \times 10^{-6}/°$ C.

The SiC 20 should preferably have an average open pore diameter in the range from 0.5 $\mu$m to 100 $\mu$m. If the average open pore diameter of the SiC 20 were less than 0.5 $\mu$m, then it would be difficult for the open pores to be impregnated with the copper alloy 20, resulting in a reduction in the coefficient of thermal conductivity. If the average open pore diameter of the SiC 20 were in excess of 100 $\mu$m, then the mechanical strength of the SiC 20 would be lowered, and the coefficient of thermal expansion of the composite material would not be reduced.

The SiC 20 should preferably have such a distribution of average open pores (pore distribution) that open pores having diameters in the range from 0.5 $\mu$m to 100 $\mu$m constitute 90% or more of all the pores. If open pores having diameters in the range from 0.5 $\mu$m to 100 $\mu$m did not constitute 90% or more of all the pores, then the SiC 20 would have more open pores not impregnated with the copper alloy 22, and the coefficient of thermal conductivity of the composite material would be reduced.

The porosity, the pore diameter, and the pore distribution were measured using an automatic porosimeter (tradename: Autopore 9200) manufactured by Shimadzu Corp.

The SiC 20 should have a flexural strength of 10 MPa or higher, preferably 20 MPa or higher, or more preferably 30 MPa or higher. If the flexural strength of the SiC 20 were lower than 10 MPa, then the coefficient of thermal expansion of the composite material would be increased.

An experiment which indicates how a coefficient of thermal conductivity and a coefficient of thermal expansion differ when the porosity, the pore diameter, and the pore distribution of the SiC 20 are changed will be described below. The results of the experiment are shown in FIG. 3.

FIG. 3 shows inventive examples 1 to 8 in which an impregnating material of copper was used and the porosity, the pore diameter, and the pore distribution were changed in respective ranges. In inventive example 9, an impregnating material was a copper alloy 22 composed of 0.5 wt. % of Be and the remainder of Cu, and the porosity, the pore diameter, and the pore distribution were changed in the respective ranges. In comparative example 1, an impregnating material was copper, and the porosity was outside of the range. In comparative example 2, an impregnating material was copper, and the porosity and the pore distribution were outside of the respective ranges. In comparative example 3, an impregnating material was copper, and the pore diameter and the pore distribution were outside of the respective ranges.

It can be seen from the experimental results that each of inventive examples 1 to 9 satisfies the coefficient of thermal conductivity=180 W/mK (at room temperature) or higher and the coefficient of thermal expansion=$4.0 \times 10^{-6}/°$ C. to $9.0 \times 10^{-6}/°$ C.

In comparative example 1, the porosity has a value lower than the range, and hence the impregnation ratio of copper is low, resulting in a low coefficient of thermal conductivity of 165 W/mK. In comparative example 2, since the porosity has a value higher than the range, the impregnation ratio of copper is high, resulting in a high coefficient of thermal conductivity of 325 W/mK, but the mechanical strength of the SiC 20 is correspondingly low, resulting in a high coefficient of thermal expansion of $12.4 \times 10^{-6}/°$ C.

The experimental results of inventive examples 1 to 8 are plotted in a graph having a horizontal axis representing the coefficient of thermal conductivity and a vertical axis representing the coefficient of thermal expansion. The curve a represents the characteristics of composite materials in which the SiC 20 is impregnated with copper. The curve b represents theoretical values of composite materials obtained by a powder molding of the SiC20 and aluminum. The curve c represents theoretical values of composite materials obtained by a powder molding of the SiC20 and copper. The curve d represents measured values of composite materials made of the SiC20 impregnated with aluminum.

In FIG. 4, a region A (indicated by a dot-and-dash-line elliptical pattern) represents the characteristics of Cu—W which has heretofore been used as a heat sink material. As shown in FIG. 3, inventive examples 6 to 8 exhibit better characteristics than the characteristics of Cu—W. This is because the range of the coefficient of thermal expansion of each of inventive examples 6 to 8 is substantially the same as the range of the coefficient of thermal expansion of Cu—W, and the range of the coefficient of thermal conductivity of each of inventive examples 6 to 8 is higher than the range of the coefficient of thermal conductivity of Cu—W. The characteristics of inventive examples 6 to 8 fall in a region B (indicated by a broken-line rectangular pattern) optimum for heat sink materials. Therefore, the characteristics of composite materials can be brought into a characteristic region optimum for heat sink materials by optimizing the porosity, the pore diameter, and the pore distribution of the SiC 20.

Methods of manufacturing composite materials according to first and second embodiments of the present invention will be described below with reference to FIGS. 5A to 15. Each of these methods generally comprises an impregnating process and a cooling process. According to the impregnating process, the SiC 20 serving as a base and the copper alloy 22 are heated while being held out of contact with each other, and when they reach a predetermined temperature, they are brought into contact with each other and then immediately subjected to a high pressure, thus impregnating the SiC 20 with the copper alloy 22. According to the cooling process, the SiC 20 impregnated with the copper alloy 22 is cooled.

Figure 5A:
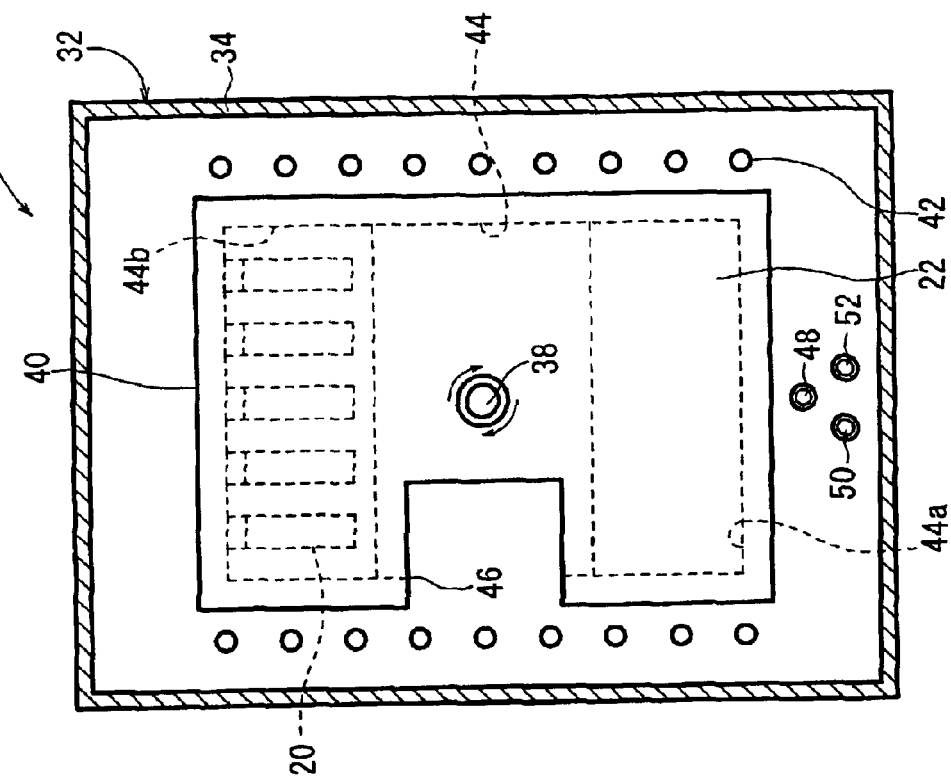
FIG. 5A is a front elevational view, partly broken away, of a high-pressure vessel.
Figure 5B:
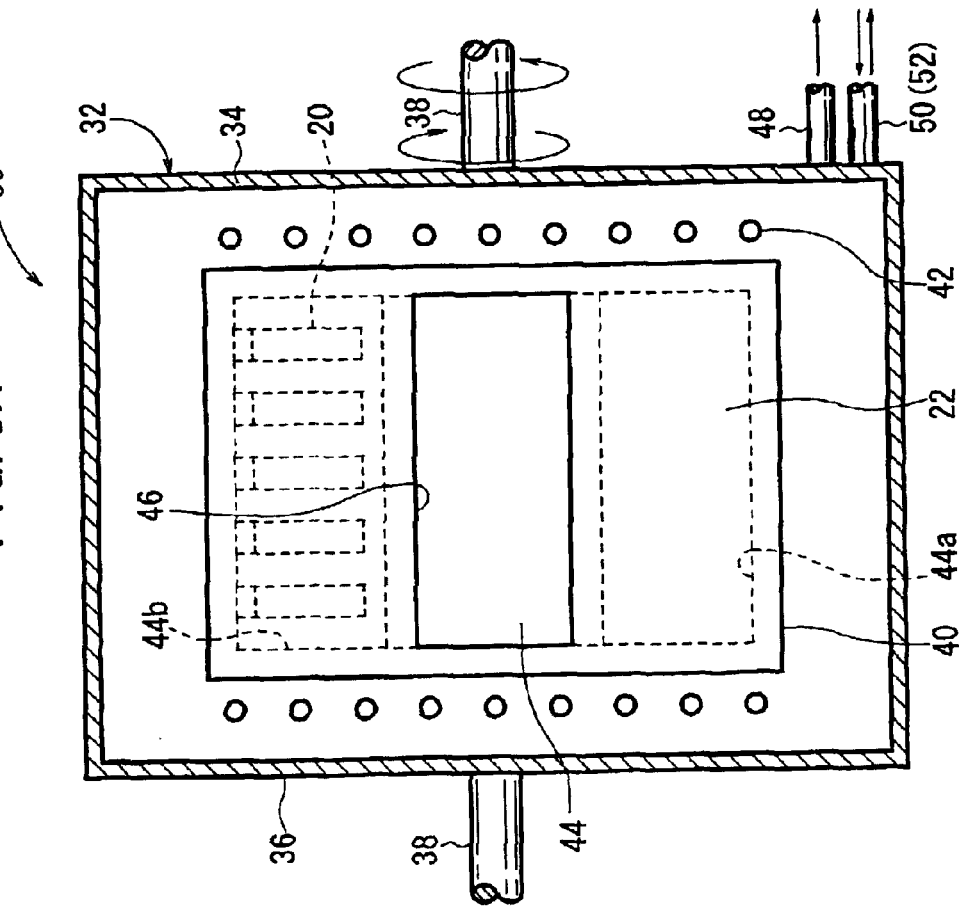
FIG. 5B is a side elevational view, partly broken away, of the high-pressure vessel.

The method of manufacturing the composite material according to the first embodiment employs a high-pressure vessel 30 shown in FIGS. 5A and 5B. The high-pressure vessel 30 comprises a hollow prismatic housing 32 including a pair of opposite side plates 34, 36 with respective rotational shafts 38 mounted centrally thereon. The housing 32 can be rotated about the rotational shafts 38.

The housing 32 accommodates therein a refractory casing 40 and a heater 42 for heating the refractory casing 40. The refractory casing 40 is of a hollow prismatic shape having a space 44 therein, and has a vertically extending opening 46 defined centrally in a side plate thereof and communicating with the space 44. The space 44 is divided by the opening 46 into two opposite compartments. One of the compartments (hereinafter referred to as "first chamber 44a") contains a solid mass of the copper alloy 22 or a molten mass of the copper alloy 22 as an impregnating material, and the other compartment (hereinafter referred to as "second chamber 44b") contains a plurality of bodies of the SiC 20 as an impregnated specimen. The refractory casing 40 incorporates therein a mechanism for supporting the SiC 20 to prevent the SiC 20 from dropping when the second chamber 44b is positioned above the first chamber 44a. The heater 42 is of such a structure that it will not be broken under a high pressure of 100 kgf/cm².

To the high-pressure vessel 30, there are connected a suction pipe 48 for evacuating the housing 32, and gas inlet and outlet pipes 50, 52 for introducing and discharging a gas for applying a high pressure and a cooling gas.

The impregnating process and the cooling process which employ the high-pressure vessel 30 will be described below with reference to FIG. 6. The impregnating process is carried out as follows:

The high-pressure vessel 30 is brought into an initial state, positioning the first chamber 44a in the refractory casing 40 in a lower position in step S1.

Then, the bodies of the SiC 20 and the mass of the copper alloy 22 are placed in the refractory casing 40, i.e., the mass of the copper alloy 22 is placed in the first chamber 44a and the bodies of the SiC 20 are placed in the second chamber 44b in step S2. Thereafter, the high-pressure vessel 30 and the refractory casing 40 are sealed, and the high-pressure vessel 30 is evacuated through the suction pipe 48, developing a negative pressure therein in step S3.

Then, the heater 42 is energized to heat the copper alloy 22 in the first chamber 44a into a molten state in step S4. The copper alloy 22 heated into a molten state will hereinafter be referred to as "molten copper".

When a temperature of the molten copper in the first chamber 44a reaches a predetermined temperature, the high-pressure vessel 30 is turned 180° about the rotational shafts 38 in step S5. Since the first chamber 44a is brought into an upper position, the molten copper in the first chamber 44a falls by gravity into the second chamber 44b, immersing the SiC 20 in the molten copper.

Thereafter, an impregnating gas is introduced via the gas inlet pipe 50 into the high-pressure vessel 30, pressurizing the high-pressure vessel 30 in step S6. The pressure build-up in the high-pressure vessel 30 forces the molten copper into open pores in the SiC 20.

After the above impregnating process, the cooling process is immediately initiated. In the cooling process, the high-pressure vessel 30 is turned 180° about the rotational shafts 38 again in step S7. As the first chamber 44a is brought into the lower position, the molten copper in the second chamber 44b falls by gravity into the first chamber 44b. Because part of the molten copper has been introduced into the open pores in the SiC 20 during the pressurizing (impregnating) procedure in step S6, the molten copper which has fallen into the first chamber 44b is a remainder which has not been introduced into the open pores in the SiC 20. When the remaining molten copper falls into the first chamber 44a, the SiC 20 impregnated with the molten copper is left in the second chamber 44b.

Thereafter, the impregnating gas in the high-pressure vessel 30 is discharged through the gas outlet pipe 52, and a cooling gas is introduced through the gas inlet pipe 50 into the high-pressure vessel 30 in step S8. As the impregnating gas is discharged into the high-pressure vessel 30 and the cooling gas is introduced into the high-pressure vessel 30, the cooling gas is thoroughly circulated in the high-pressure vessel 30, quickly cooling the high-pressure vessel 30. When the high-pressure vessel 30 is quickly cooled, the molten copper impregnated in the SiC 20 is rapidly solidified into a solid mass of the copper alloy 22. Because the volume of the molten copper is expanded when it is thus solidified, the impregnated copper alloy 22 is firmly retained in the SiC 20.

According to another cooling process, as indicated by a dot-and-dash-line block in FIG. 6, after the processing in step S7 is finished, the high-pressure vessel 30 or the SiC 20 impregnated with the molten copper is brought into contact with a chill block in step S9. The SiC 20 is quickly cooled in contact with the chill block. In the cooling process, the SiC 20 may be cooled while the chill block is being cooled with water, or the chill block may be positioned away from a heating body. Particularly, the SiC 20 may be cooled in view of a feeder effect.

While it has heretofore been difficult to impregnate the SiC 20 with the molten copper, the impregnating process and the cooling process as described above are effective to impregnate the SiC 20 with the molten copper easily. According to the impregnating process and the cooling process as described above, furthermore, the impregnation ratio of the SiC 20 with the molten copper can be increased, making it possible to increase the productivity of the heat sink 10 which has characteristics balanced against the coefficient of thermal expansion and the coefficient of thermal conductivity of actual electronic parts (including semiconductor devices), i.e., which has an average coefficient of thermal expansion in the range from $4.0 \times 10^{-6}/°$ C. to $9.0 \times 10^{-6}/°$ C. at a temperature ranging from room temperature to 200° C. and a coefficient of thermal conductivity of 160 W/mK (at room temperature) or greater.

When the heater 42 is energized to heat the copper alloy 22 in the first chamber 44a into a molten state in step S4, the predetermined temperature which is to be reached by the molten copper before step S5 should be higher than the melting point of the copper alloy 22 by a temperature ranging from 30° C. to 250° C., or preferably by a temperature ranging from 50° C. to 200° C. At this time, the high-pressure vessel 30 should preferably be evacuated to a vacuum under the pressure of $1 \times 10^{-3}$ Torr or less.

The pressure to be applied to the high-pressure vessel 30 by introducing the impregnating gas into the high-pressure vessel 30 in step S6 should be in the range from 10 kgf/cm² to 1000 kgf/cm², preferably from 50 kgf/cm² to 200 kgf/cm², or more preferably from 100 kgf/cm² to 150 kgf/cm².

The pressure should be applied to the high-pressure vessel 30 for a period of time ranging from 1 to 60 seconds, or preferably a period of time ranging from 1 to 30 seconds.

As described above, the open pores in the SiC 20 which have diameters in the range from 0.5 μm to 100 μm should constitute 90% or more of all the pores, and the porosity of the SiC 20 should be in the range from 10 vol. % to 70 vol. %.

To improve wettability between the SiC 20 and the copper alloy 22, it is preferable to plate the SiC 20 with nickel (Ni) in the range from 1 vol. % to 10 vol. %, or preferably in the range from 3 vol. 1 to 5 vol. % before the SiC 20 is impregnated with the copper alloy 22. The plated nickel allows the SiC 20 to be impregnated with the molten copper under a lower pressure. The SiC 20 should be plated with a nickel material which will not be molten when it is preheated, e.g., an alloy of Ni—P—W or Ni—B—W.

To improve wettability between the SiC 20 and the copper alloy 22, it is preferable to impregnate the SiC 20 with silicon (Si) in the range from 1 vol. % to 10 vol. %, or preferably in the range from 3 vol. % to 5 vol. % before the SiC 20 is impregnated with the copper alloy 22. The impregnated silicon allows the SiC 20 to be impregnated with the molten copper under a lower pressure.

In relation to the plating of the SiC 20 with nickel in the range from 1 vol. % to 10 vol. % or the impregnating of the SiC 20 with silicon in the range from 1 vol. % to 10 vol. %, the SiC 20 may be plated with palladium. The SiC 20 may be plated with an independent layer of palladium or may be plated with a composite layer of palladium, nickel, and silicon.

In the cooling process, the high-pressure vessel 30 should preferably be cooled at a cooling rate of −400° C./hour or greater or more preferably be cooled at a cooling rate of −800° C./hour or greater from the temperature at the time the SiC 20 is impregnated with the molten copper to the temperature of 800° C.

The pressure to be applied to the high-pressure vessel 30 in step S6 is a pressure necessary to introduce the copper alloy 22 fully into the open pores in the SiC 20. A high pressure is required to be applied to the high-pressure vessel 30 because thermal conductivity of the heat sink 10 would greatly be impaired if the SiC 20 had open pores remaining unimpregnated with the copper alloy 22.

The pressure to be applied to the high-pressure vessel 30 can roughly be estimated by the Washburn's equation, and needs to be larger as the pore diameter is smaller. For example, if the pore diameter is 0.1 μm, then the pressure to be applied to the high-pressure vessel 30 is 400 kgf/cm², if the pore diameter is 1.0 μm, then the pressure to be applied to the high-pressure vessel 30 is 40 kgf/cm², and if the pore diameter is 10 μm, then the pressure to be applied to the high-pressure vessel 30 is 4 kgf/cm².

At high temperatures, the SiC 20 and the copper alloy 22 react with each other, and the SiC 20 is decomposed into Si and C, failing to perform its intended functions. Therefore, it is necessary to shorten the period of time in which the SiC 20 and the copper alloy 22 are held in direct contact with each other at high temperatures. By satisfying a first processing condition (the pressure to be applied to the high-pressure vessel 30 is in the range from 10 kgf/cm² to 1000 kgf/cm²), a second processing condition (the predetermined temperature which is to be reached by the molten copper is higher than the melting point of the copper alloy 22 by a temperature ranging from 30° C. to 250° C.), or a third processing condition (the SiC 20 is plated in advance with nickel in the range from 1 vol. % to 10 vol. %), the period of time in which the SiC 20 and the copper alloy 22 are held in direct contact with each other can be reduced, thus avoiding the decomposition of the SiC 20.

Inasmuch as the SiC 20 and the copper alloy 22 have poor wettability with respect to each other, it is necessary to apply a high pressure in order to sufficiently impregnate the SiC 20 with the copper alloy 22. By satisfying the third processing condition (the SiC 20 is plated in advance with nickel in the range from 1 vol. % to 10 vol. %), or a fourth processing condition (the SiC 20 is impregnated in advance with silicon in the range from 1 vol. % to 10 vol. %), the porous surface of the SiC 20 is improved and the wettability between the SiC 20 and the copper alloy 22 is increased. Therefore, the copper alloy 22 can be introduced into smaller pores in the SiC 20 under a lower pressure.

An experiment which indicates how the reaction of SiC and Cu and an impregnated state of Cu differ when the porosity and pore diameter of the SiC 20, the impregnating temperature, the pressure, the pressurizing time, and the cooling rate are changed, and depending on whether Ni is plated or not and Si is impregnated or not will be described below. The results of the experiment are shown in FIG. 7. In FIG. 7, the reaction of SiC and Cu was determined by the thickness (average value) of a reaction layer formed between the SiC 20 and the Cu, under conditions described below. These conditions are given for the reasons that if a reaction layer having a thickness of 5 μm or greater is produced between the SiC 20 and the Cu, then heat transfer between the SiC 20 and the Cu will be impaired, and the coefficient of thermal conductivity of the resulting composite material for use as a composite material for a semiconductor heat sink will be lowered.

The thickness (average) of the reaction layer is 1 μm or smaller→"no reaction".

The thickness (average) of the reaction layer exceeds 1 μm and is 5 μm or smaller→"low reaction".

The thickness (average) of the reaction layer exceeds 5 μm→"high reaction".

The experimental results show that those samples 3, 7, 8, 11, and 12 in which the porosity and pore diameter of the SiC 20, the impregnating temperature, the pressure, the pressurizing time, and the cooling rate fall in respective given ranges exhibit good results because "no reaction" occurs between the SiC 20 and the Cu and the Cu is impregnated well.

Of these samples, the samples 3, 7, 11, and 12 have the SiC 20 plated with nickel or impregnated with silicon, and hence the SiC 20 has good wettability with respect to the Cu. Therefore, the samples 3, 7, 11, and 12 exhibit good results even though the pressurizing time is short. Although the SiC 20 is neither plated with nickel nor impregnated with silicon in the sample 8, the sample 8 exhibits good results because the pressurizing time is reduced by increasing the pressure.

The samples 1, 5, and 9 in which the pressure is 8 kgf/cm$^2$ which is lower than the given range have the SiC 20 insufficiently impregnated with the Cu. Of these samples, the samples 1, 5 whose pressurizing time is longer suffer "high reaction" between the SiC 20 and the Cu.

The sample 6 has the SiC 20 insufficiently impregnated with the Cu though "low reaction" occurs between the SiC 20 and the Cu because the porosity and the pore diameter do not fall in the respective given ranges. The sample 14 suffers "high reaction" between the SiC 20 and the Cu though the SiC 20 is well impregnated with the Cu because the pore diameter falls in the given range and the pressurizing time is relatively long.

The SiC (Si—SiC sintered body) impregnated with Si for better wettability with respect to the copper alloy 22 may be in the form of an Si—SiC sintered body containing as a main phase 2 wt. % to 25 wt. % of Si and 75 wt. % to 98 wt. % of SiC. To produce the Si—SiC sintered body, it is preferable to control an Al impurity at 0.2 part by weight or less and SiO$_2$ at 3.0 parts by weight or less with respect to 100 parts by weight of the main phase, and also to control the overall amount of impurities at a range from 0.4 part by weight to 4.2 parts by weight with respect to 100 parts by weight of the main phase.

Specifically, a process of producing the Si—SiC sintered body will be described below. A raw material containing an SiC powder, a carbon powder, an organic binder, and water or an organic solvent is used.

The raw material is kneaded and then molded to a given shape, thus producing a molded body. The molded body is then placed in the presence of metal silicon in a reduced-pressure inactive gas atmosphere or a vacuum. The molded body is now impregnated with metal silicon, and then sintered into an Si—SiC sintered body.

The raw material may be molded by a pressing process, a casting process, or an extrusion molding process. Of these processes, the pressing process is preferable from the standpoint of mass-productivity. The pressing process should preferably be carried out by a hydraulic press. The hydraulic press usually exerts a pressure ranging from 50 kg/cm$^2$ to 2000 kg/cm$^2$.

Modifications of the impregnating process of the method of manufacturing the composite material according to the first embodiment will be described below with reference to FIGS. 8 and 9.

In the impregnating process according to the first modification, as shown in FIG. 8, the high-pressure vessel 30 is brought into an initial state, positioning the first chamber 44a in the refractory casing 40 in a lower position in step S101.

Then, the SiC 20 is set in the second chamber 44b, and the copper alloy which is molten (molten copper) 22 is poured into the first chamber 44a in step S102.

When a temperature of the molten copper in the first chamber 44a reaches a predetermined temperature, the high-pressure vessel 30 is turned 180° about the rotational shafts 38 in step S103. When the high-pressure vessel 30 is thus turned 180°, the molten copper in the first chamber 44a falls by gravity into the second chamber 44b which is now in the lower position, immersing the SiC 20 in the molten copper.

Thereafter, an impregnating gas is introduced via the gas inlet pipe 50 into the high-pressure vessel 30, pressurizing the high-pressure vessel 30 in step S104. The pressure build-up in the high-pressure vessel 30 forces the molten copper into open pores in the SiC 20.

The impregnating process according to the second modification employs a high-pressure vessel 30 with a partition plate (not shown) of porous ceramic material disposed centrally in a refractory casing 40 in the high-pressure vessel 30. The space in the refractory casing 40 is divided by the partition plate into a first chamber 44a and a second chamber 44b.

The porous ceramic material of the partition plate should preferably have a porosity ranging from 40% to 90% and pore diameters ranging from 0.5 mm to 3.0 mm, and more preferably have a porosity ranging from 70% to 85% and pore diameters ranging from 1.0 mm to 2.0 mm.

Figure 9:
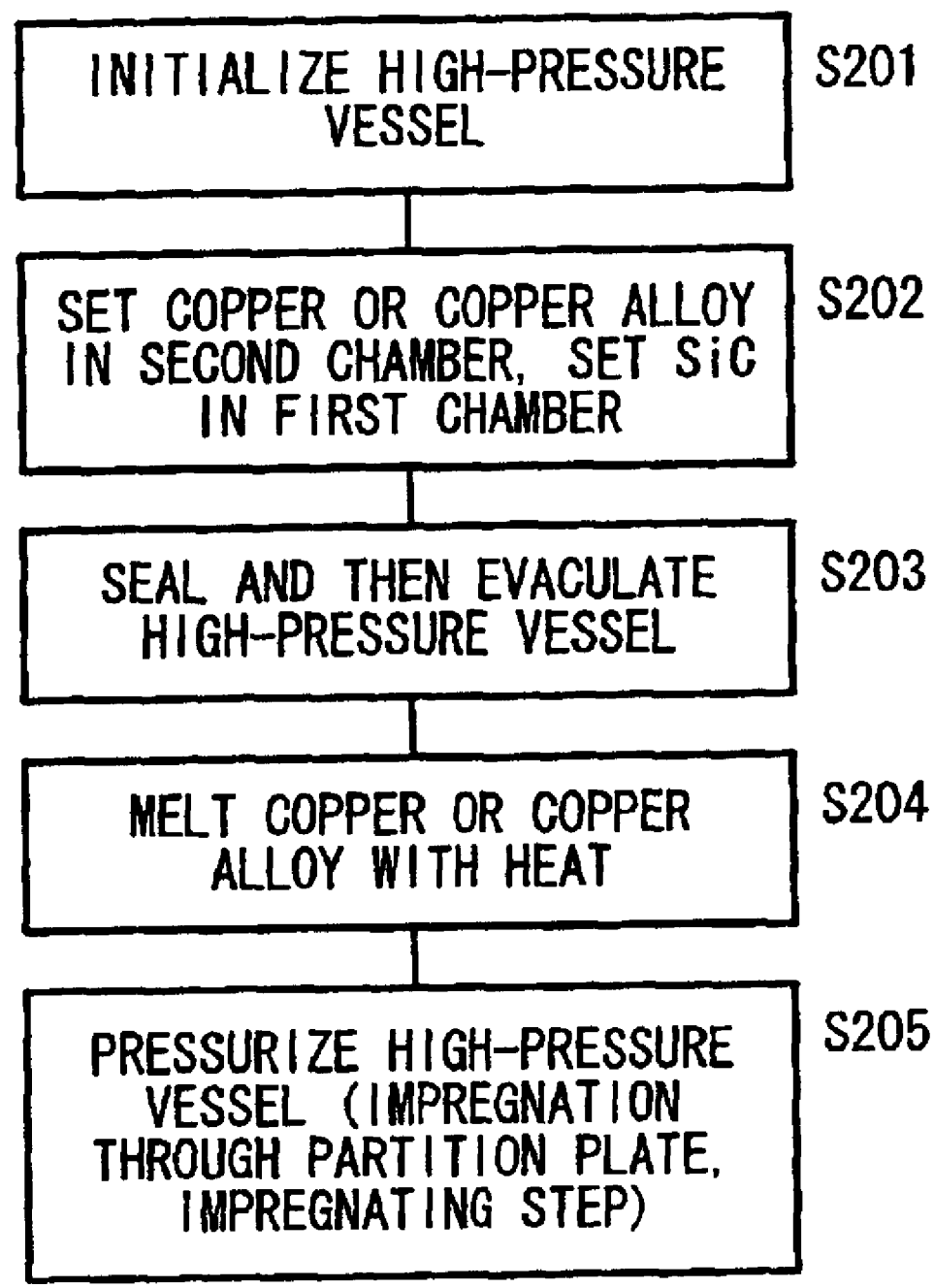
FIG. 9 is a flowchart of an impregnating process according to a second modification.

In the impregnating process according to the second modification, as shown in FIG. 9, the high-pressure vessel 30 is brought into an initial state, positioning the first chamber 44a in the refractory casing 40 in a lower position and the second chamber 44b in an upper position in step S201.

Then, the SiC 20 and the mass of the copper alloy 22 are placed in the refractory casing 40, i.e., the mass of the copper alloy 22 is placed in the second chamber 44b and the SiC 20 is placed in the first chamber 44a in step S202.

Thereafter, the high-pressure vessel 30 and the refractory casing 40 are sealed, and the high-pressure vessel 30 is evacuated through the suction pipe 48, developing a negative pressure therein in step S203.

Then, the heater 42 is energized to heat the copper alloy 22 in the second chamber 44b into a molten state in step S204. When a temperature of the molten copper reaches a predetermined temperature, an impregnating gas is introduced via the gas inlet pipe 50 into the high-pressure vessel 30, pressurizing the high-pressure vessel 30 in step S205. The pressure build-up in the high-pressure vessel 30 forces the molten copper in the second chamber 22b in the upper position to pass through the partition plate into open pores in the SiC 20 in the first chamber 44a in the lower position.

A method of manufacturing a composite material according to a second embodiment of the present invention will be described below with reference to FIGS. 10 to 15.

Figure 10:
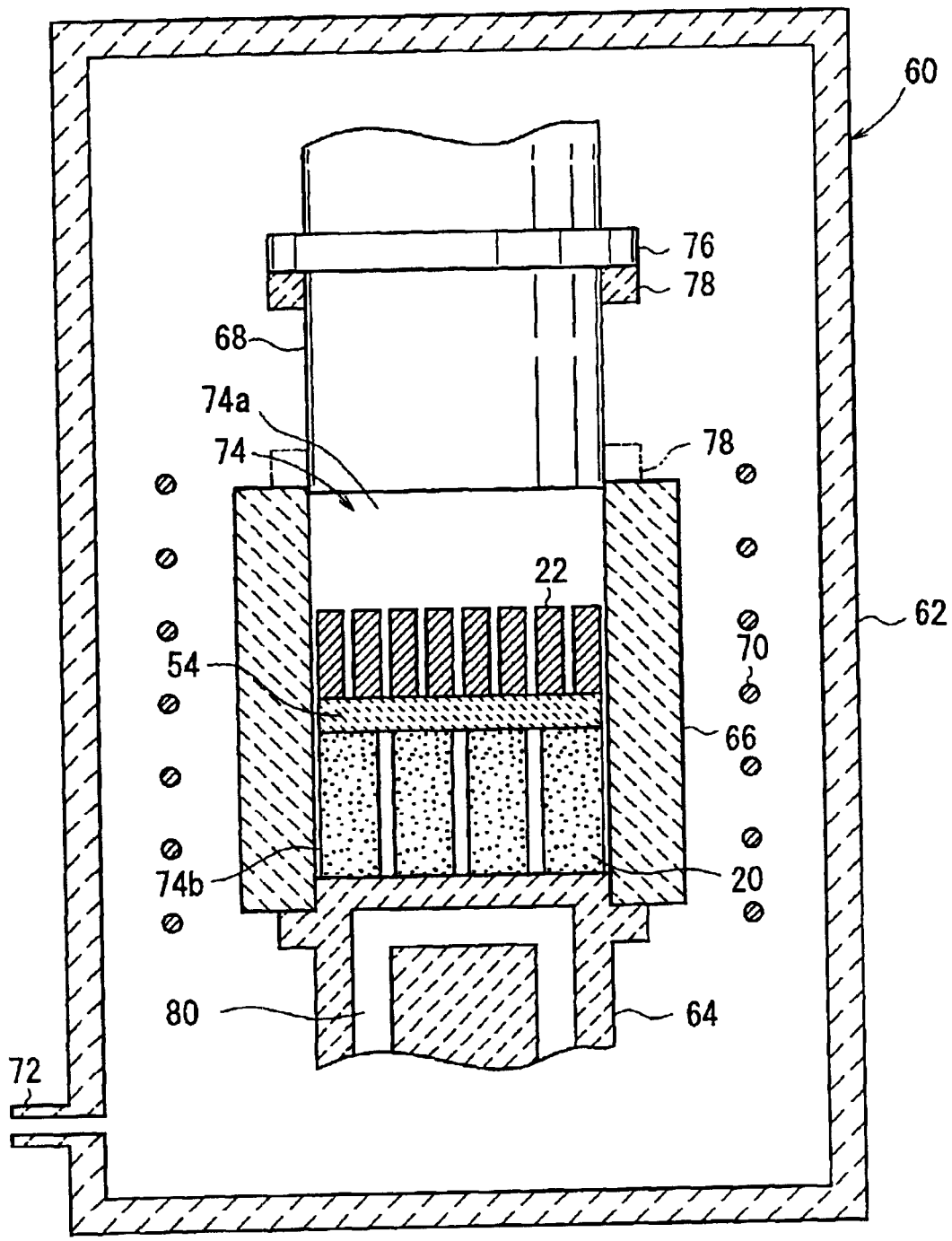
FIG. 10 is a cross-sectional view of a hot press furnace for use in a method of manufacturing a composite material according to a second embodiment of the present invention.

The method of manufacturing the composite material according to the second embodiment employs a hot press furnace 60 shown in FIG. 10. The hot press furnace 60 comprises a tubular housing 62 accommodating therein a lower punch 64 serving as a base, an upwardly open refractory casing 66 fixedly mounted on the lower punch 64, an upper punch 68 movable into and out of the refractory casing 66 through its upper opening, and a heater 70 for heating the refractory casing 66. The hot press furnace 60 has a suction pipe 72 for evacuating the housing 62.

The refractory casing 66 is of a tubular shape with a space 74 defined therein. The upper punch 68 has a flange 76 on its side wall for determining the stroke thereof. A packing 78 is attached to the lower surface of the flange 76 for contacting the upper end surface of the refractory casing 66 to sealingly close the refractory casing 66. The lower punch 64 has a passage 80 defined therein for passing therethrough a heating fluid for heating the space 74 in the refractory casing 66 and a cooling fluid for cooling the space 74 in the refractory casing 66.

The method of manufacturing the composite material according to the second embodiment is carried out according to a flowchart shown in FIG. 11.

Bodies of the SiC 20, a filter 54 of porous ceramic material, and masses of the copper alloy 22, which are arranged successively upwardly in the order named, are charged into the space 74 in the refractory casing 66 in step S301. The porous ceramic material of the filter 54 should preferably have a porosity ranging from 40% to 90% and pore diameters ranging from 0.5 mm to 3.0 mm, and more preferably have a porosity ranging from 70% to 85% and pore diameters ranging from 1.0 mm to 2.0 mm.

The filter 54 functions as a partition plate separating the bodies of the SiC 20 and the masses of the copper alloy 22 from each other to keep them out of contact with each other. The portion of the space 74 in which the masses of the copper alloy 22 are set above the filter 54 is defined as an upper chamber 74*a*, and the portion of the space 74 in which the bodies of the SiC 20 are set beneath the filter 54 is defined as a lower chamber 74*b*.

After the refractory casing 66 is sealed, the refractory casing 66 is evacuated through the suction pipe 72 to develop a negative pressure in the chambers 74*a*, 74*b* in the refractory casing 66 in step S302.

Then, the heater 70 is energized to heat the masses of the copper alloy 22 in the upper chamber 74*a* into a molten state in step S303. At the same time that the heater 70 is energized, the heating fluid may be passed through the passage 80 in the lower punch 64 to heat the space 74 in the refractory casing 66.

When a temperature of the molten copper of the copper alloy 22 in the upper chamber 74*a* reaches a predetermined temperature, the upper punch 68 is moved downwardly to pressurize the upper chamber 74*a* to a predetermined pressure in step S304. At this time, the packing 78 mounted on the flange 76 of the upper punch 68 and the upper end surface of the refractory casing 66 are held and pressed against each other, sealing the refractory casing 66 to prevent the molten copper from leaking out of the refractory casing 66.

The molten copper of the copper alloy 22 in the upper chamber 74*a* under the predetermined pressure is pushed through the filter 54 into the lower chamber 74*b* under the pressure in the upper chamber 74*a*, and impregnates the SiC 20 placed in the lower chamber 74*b*.

When an endpoint preset by a given time management plan is reached, i.e., when the impregnation of the SiC 20 with the molten copper is saturated, the cooling fluid is passed through the passage 80 in the lower punch 64 to cool the refractory casing 66 progressively upwardly, thus solidifying the molten copper impregnated in the SiC 20 in step S305. Until the solidification of the molten copper is completed, the space 74 in the refractory casing 66 remains pressurized by the upper punch 68 and the lower punch 64.

When the solidification of the molten copper is completed, the SiC 20 impregnated with the molten copper is removed from the refractory casing 66 in step S306.

In the above manufacturing method, the SiC 20 and the copper alloy 22 are heated while being sufficiently deaerated, and after the copper alloy 22 is melted, it is quickly brought into contact with the SiC 20, and the SiC 20 and the copper alloy 22 are pressurized and continuously held under pressure until the cooling process is completed. Therefore, the SiC 20 can efficiently be impregnated with the copper alloy 22. While the SiC 20 is impregnated with the copper alloy 22 under a negative pressure in the above embodiment, the SiC 20 may be impregnated with the copper alloy 22 under the normal pressure.

As described above, after the molten copper and the SiC 20 are pressurized, they are brought into contact with each other to impregnate the SiC 20 with the molten copper. Therefore, any reduction in the pressure at the time the molten copper and the SiC 20 are brought into contact with each other is minimized, and the molten copper and the SiC 20 are well kept under pressure when the SiC 20 is impregnated with the molten copper.

Figure 12A:
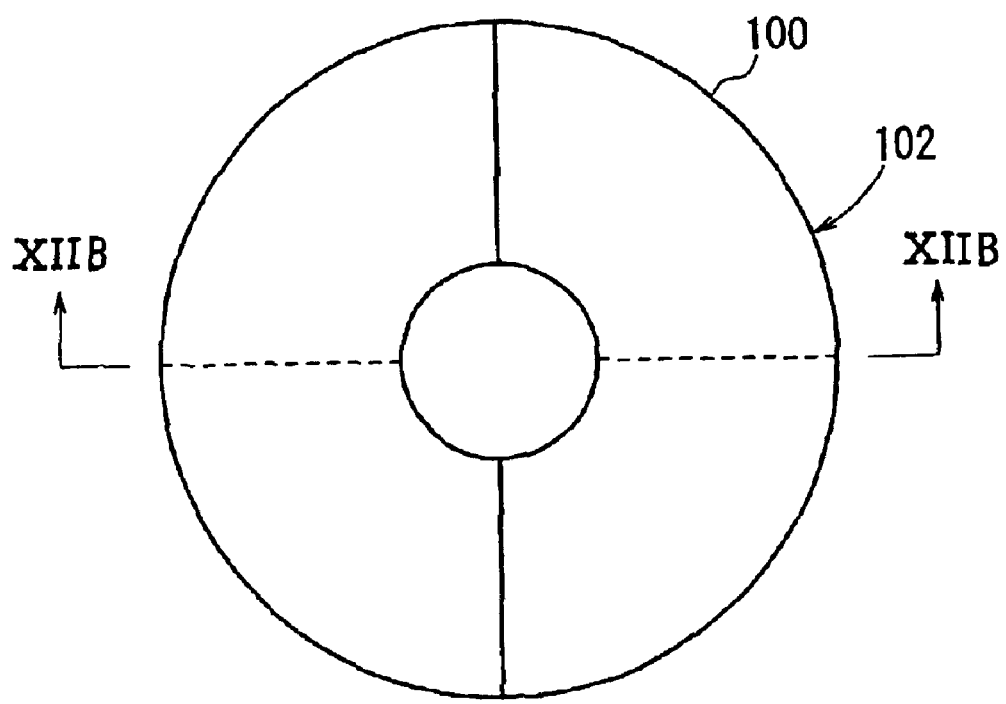
FIG. 12A is a plan view of a packing.
Figure 12B:
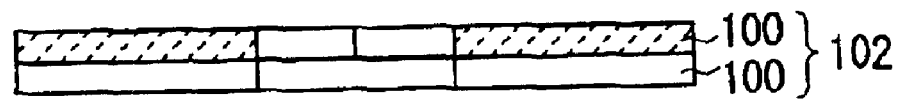
FIG. 12B is a cross-sectional view taken along line XIIB—XIIB of FIG. 12A.
Figure 13:
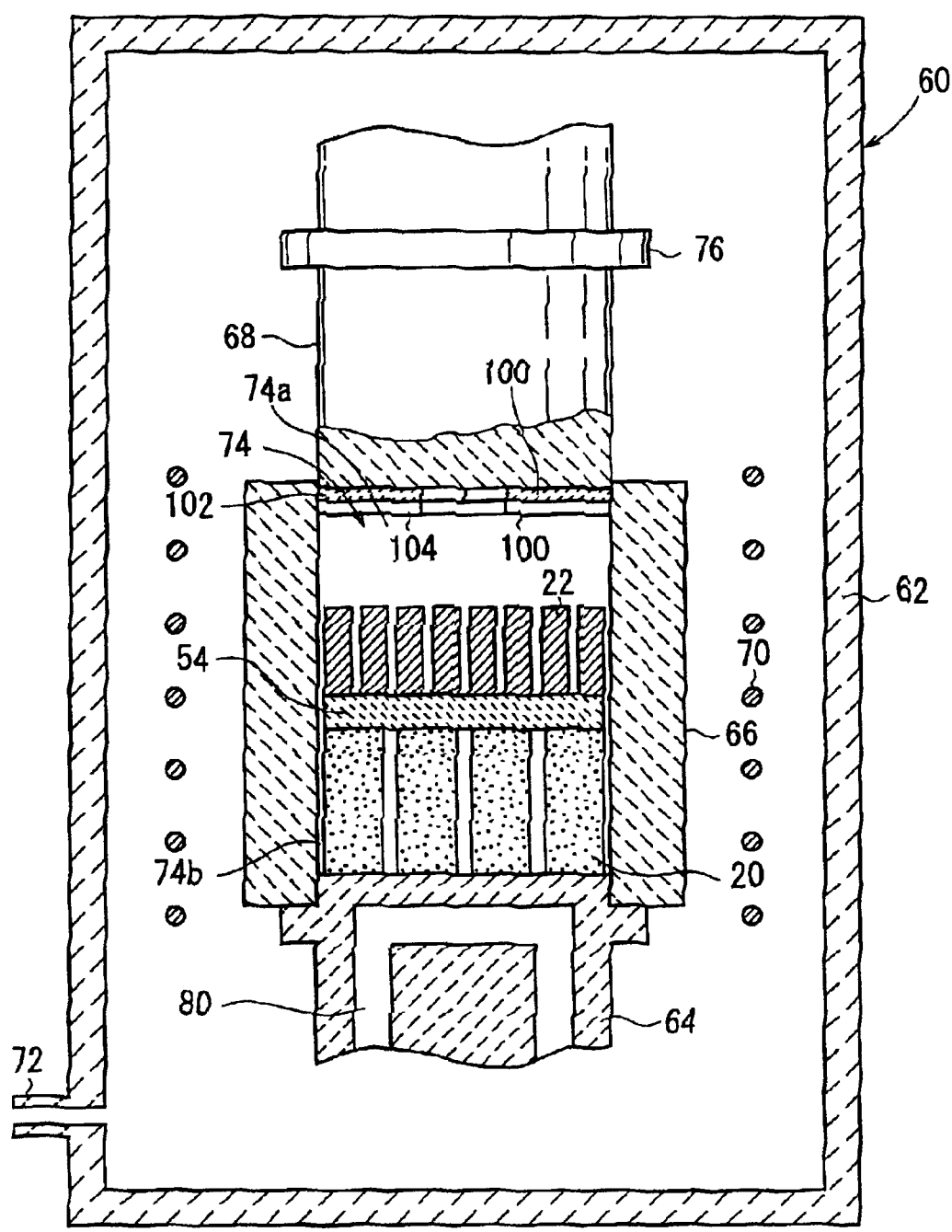
FIG. 13 is a cross-sectional view of another hot press furnace for use in the method of manufacturing the composite material according to the second embodiment.

In the above embodiment, the packing 78 is mounted on the lower surface of the flange 76 on the upper punch 68 in order to prevent the molten copper from leaking out of the refractory casing 66. However, as indicated by the two-dot-and-dash lines in FIG. 10, the packing 78 may be mounted on the upper end surface of the refractory casing 66. Alternatively, as shown in FIGS. 12A and 12B, a packing assembly 102 comprising two annular split packings 102 may be mounted on the lower end of the upper punch 68, as shown in FIG. 13. When the molten copper enters a space 104 in the packing assembly 102, each of the split packings 102 is spread radially outwardly against the refractory casing 66, thus sealing the upper chamber 74*a* to prevent the molten copper from leaking out of the refractory casing 66.

A modification of the method of manufacturing the composite material according to the second embodiment will be described below with reference to FIGS. 14 and 15. Those parts in FIG. 14 which are identical to those shown in FIG. 10 are denoted by identical reference characters, and will not be described in detail below.

Figure 14:
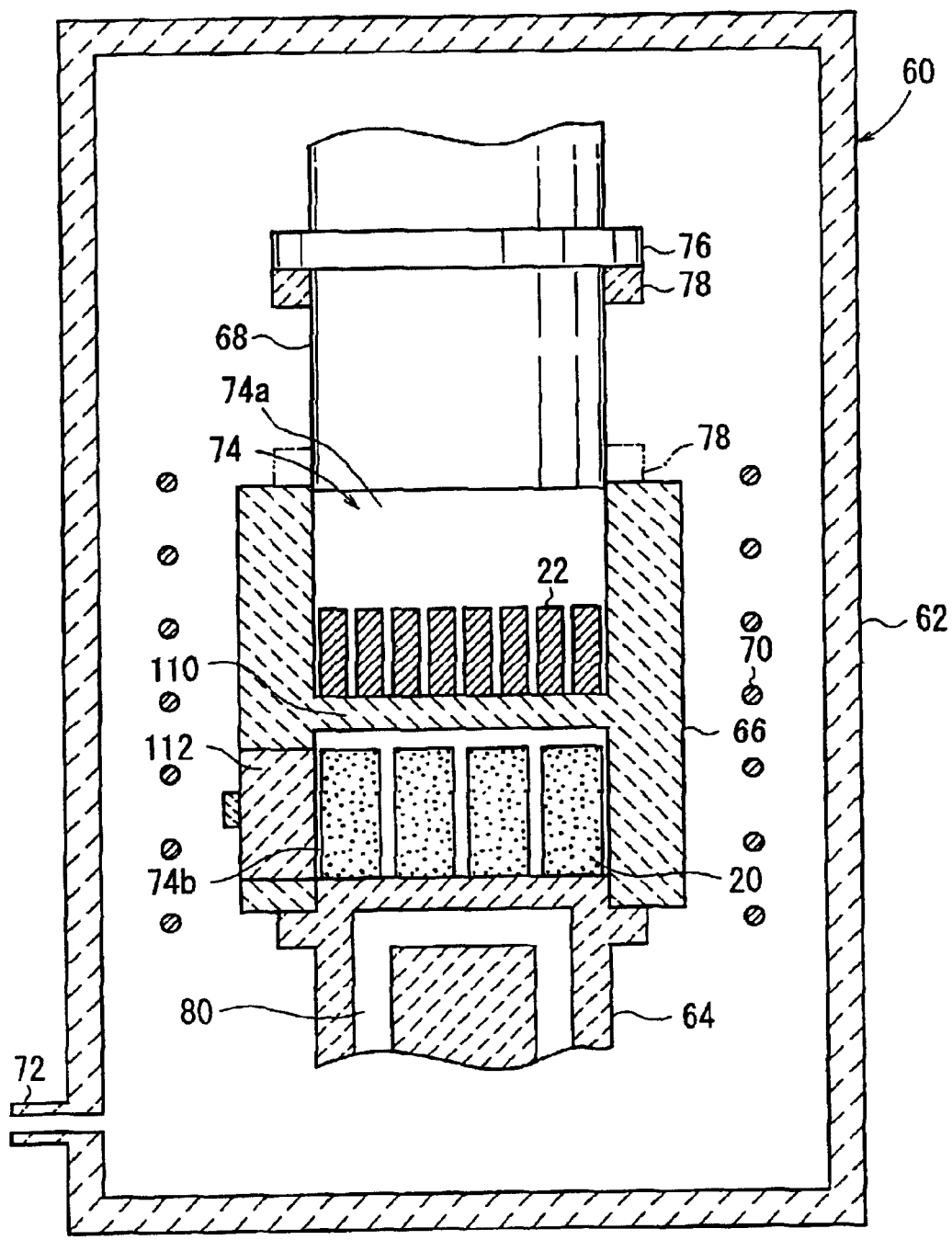
FIG. 14 is a cross-sectional view of a hot press furnace for use in a modification of the method of manufacturing the composite material according to the second embodiment.

The modification of the method of manufacturing the composite material according to the second embodiment employs a hot press furnace 60 shown in FIG. 14. The hot press furnace 60 includes a filter 110 of porous ceramic material fixedly positioned vertically centrally in the space 74 in the refractory casing 66, and a door 112 openably and closably disposed in a side wall of the lower chamber 74*b*. The portion of the space 74 which extends above the filter 110 serves as the upper chamber 74*a*, and the portion of the space 74 which extends beneath the filter 110 serves as the lower chamber 74*b*. The door 112 disposed in the side wall of the lower chamber 74*b* is of such a structure that when the door 112 is closed, it seals the lower chamber 74*b*.

Figure 15:
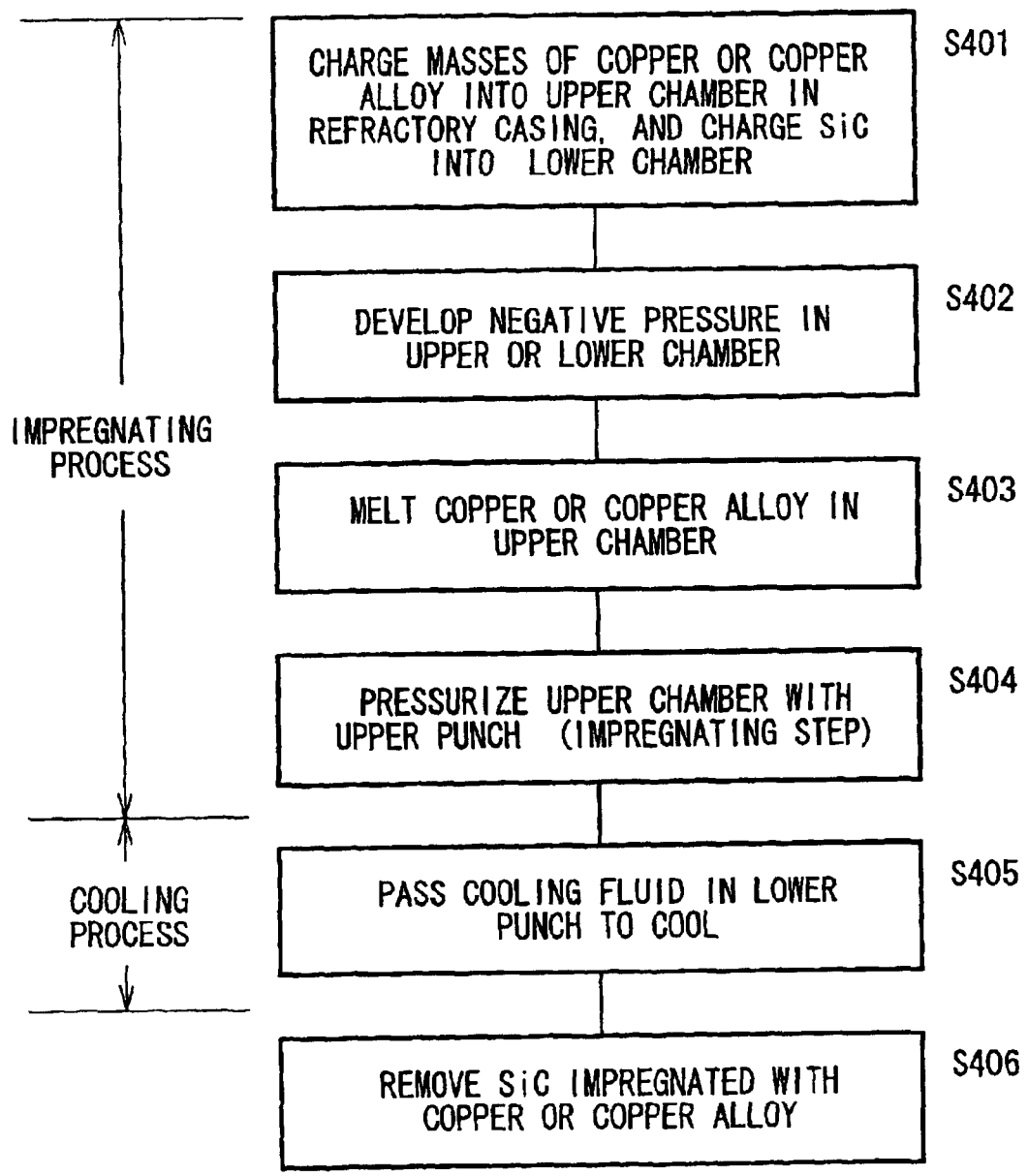
FIG. 15 is a flowchart of the modification of the method of manufacturing the composite material according to the second embodiment.

The modification of the method of manufacturing the composite material according to the second embodiment is carried out according to a flowchart shown in FIG. 15.

The masses of the copper alloy 22 are charged into the upper chamber 74*a* in the refractory casing 66, and the door 112 is opened and the bodies of the SiC 20 are charged into the lower chamber 74*b* in step S401.

Then, the door 12 is closed to seal the lower chamber 74*b*, and the hot press furnace 60 is sealed. Thereafter, the refractory casing 66 is evacuated through the suction pipe 72, developing a negative pressure in the chambers 74*a*, 74*b* in the refractory casing 66 in step S402.

Then, the heater 70 is energized to heat the masses of the copper alloy 22 in the upper chamber 74*a* into a molten state in step S403. At the same time that the heater 70 is energized, the heating fluid may be passed through the passage 80 in the lower punch 64 to heat the space 74 in the refractory casing 66.

When a temperature of the molten copper of the copper alloy 22 in the upper chamber 74*a* reaches a predetermined temperature, the upper punch 68 is moved downwardly to pressurize the upper chamber 74*a* to a predetermined pressure in step S404.

The molten copper of the copper alloy 22 in the upper chamber 74*a* under the predetermined pressure is pushed through the filter 54 into the lower chamber 74*b* under the pressure in the upper chamber 74*a*, and impregnates the SiC 20 placed in the lower chamber 74*b*.

When an endpoint preset by a given time management plan is reached, the cooling fluid is passed through the passage 80 in the lower punch 64 to cool the refractory casing 66 progressively upwardly, thus solidifying the molten copper impregnated in the SiC 20 in step S405.

When the solidification of the molten copper is completed, the SiC 20 impregnated with the molten copper is removed from the refractory casing 66 in step S406.

The above modified method of manufacturing the composite material can efficiently impregnate the SiC 20 with the copper alloy 22 as is the case with the method of manufacturing the composite material according to the second embodiment. According to the modified method, after the molten copper and the SiC 20 are pressurized, they are brought into contact with each other to impregnate the SiC 20 with the molten copper. Therefore, any reduction in the pressure at the time the molten copper and the SiC 20 are brought into contact with each other is minimized, and the molten copper and the SiC 20 are well kept under pressure when the SiC 20 is impregnated with the molten copper. While the SiC 20 is impregnated with the copper alloy 22 under a negative pressure in the above modification, the SiC 20 may be impregnated with the copper alloy 22 under the normal pressure.

A method of manufacturing a composite material according to a third embodiment of the present invention will be described below with reference to FIGS. 16 and 17. Those parts in FIG. 16 which are identical to those shown in FIG. 10 are denoted by identical reference characters, and will not be described in detail below.

The method of manufacturing the composite material according to the third embodiment is essentially the same in principle as the method of manufacturing the composite material according to the second embodiment, but differs therefrom in that in the impregnating process, the SiC 20 and the copper alloy 22 are brought into contact with each other under a negative pressure or normal pressure, and then heated to melt the copper alloy 22.

Figure 16:
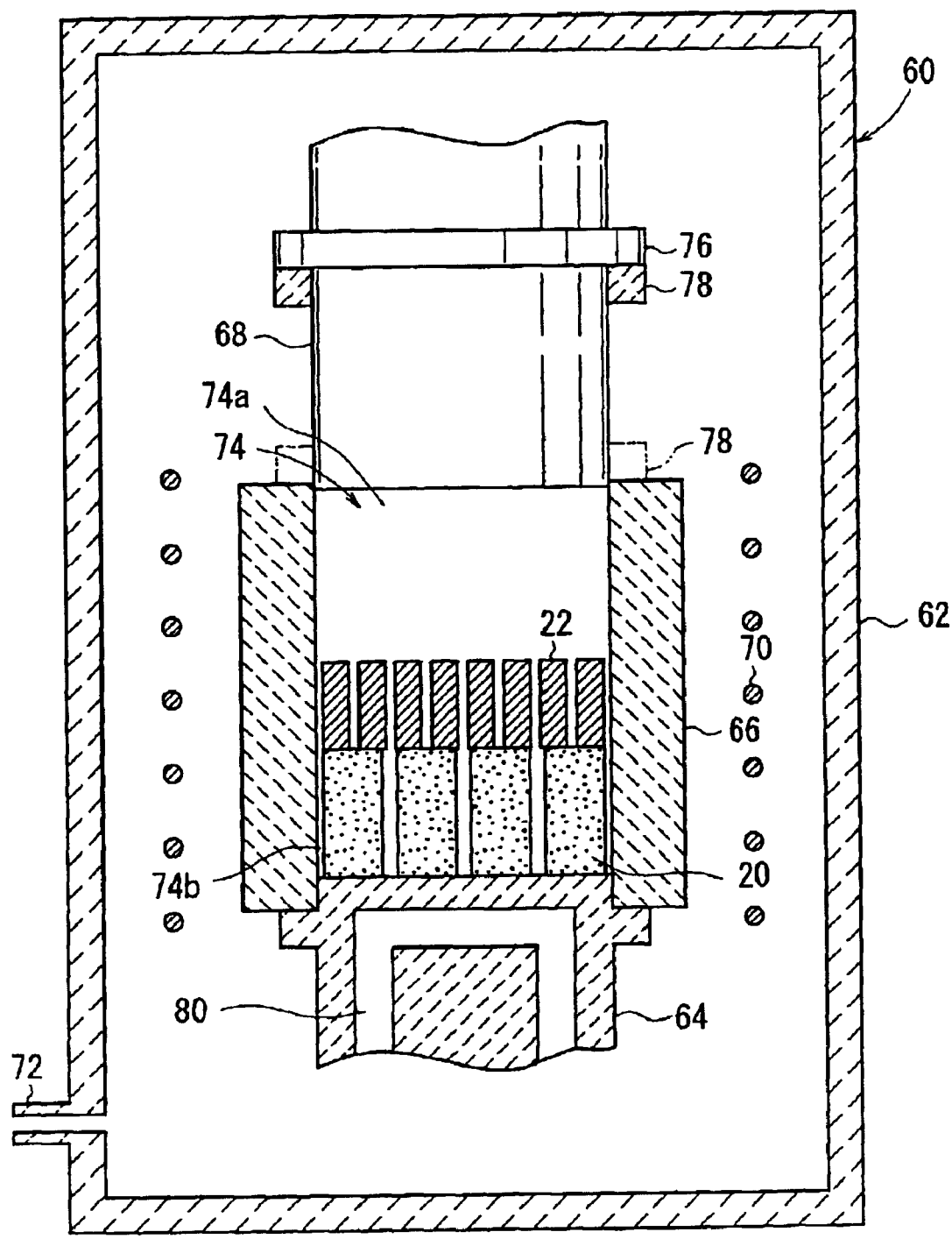
FIG. 16 is a cross-sectional view of a hot press furnace for use in a method of manufacturing a composite material according to a third embodiment of the present invention.

Specifically, as shown in FIG. 16, the filter 54 is not charged, but bodies of the SiC 20 and masses of the copper alloy 22, which are arranged successively upwardly in the order named, are charged into the refractory casing 66 of the hot press furnace 60 which is used in the method of manufacturing the composite material according to the second embodiment.

Figure 17:
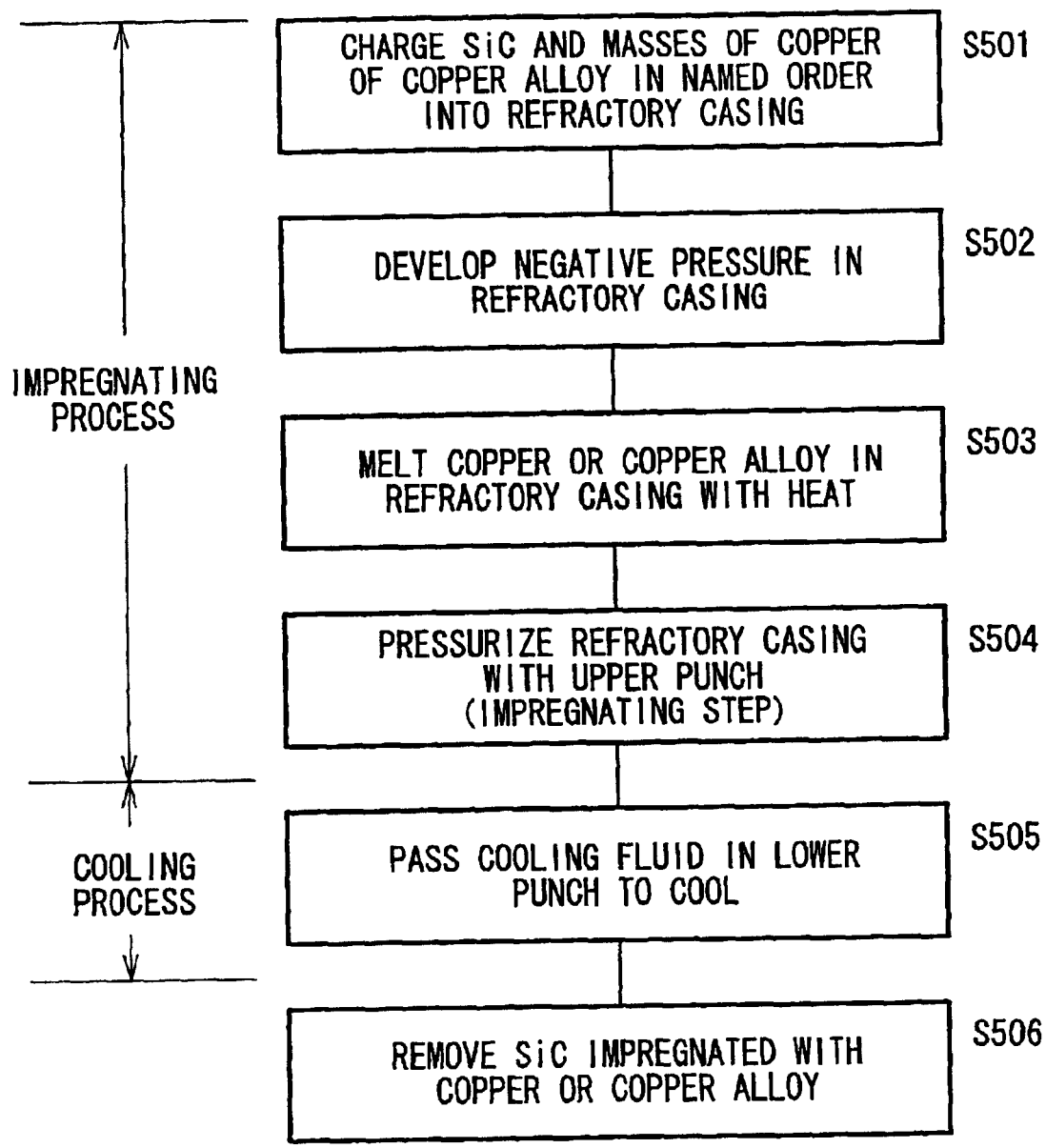
FIG. 17 is a flowchart of the method of manufacturing the composite material according to the third embodiment.

The method of manufacturing the composite material according to the third embodiment is carried out according to a flowchart shown in FIG. 17.

Bodies of the SiC 20 and masses of the copper alloy 22, which are arranged successively upwardly in the order named, are charged into the space 74 in the refractory casing 66 in step S501.

After the hot press furnace 60 is sealed, the refractory casing 66 is evacuated through the suction pipe 72 to develop a negative pressure in the refractory casing 66 in step S502. Then, the heater 70 is energized to heat the masses of the copper alloy 22 in the upper chamber 74a into a molten state in step S503. At the same time that the heater 70 is energized, the heating fluid may be passed through the passage 80 in the lower punch 64 to heat the space 74 in the refractory casing 66.

When a temperature of the molten copper of the copper alloy 22 in the refractory casing 66 reaches a predetermined temperature, the upper punch 68 is moved downwardly to pressurize the refractory casing 66 to a predetermined pressure in step S504.

The molten copper of the copper alloy 22 under the predetermined pressure is forced to impregnate the SiC 20 under the pressure in the refractory casing 66.

When an endpoint preset by a given time management plan is reached, i.e., when the impregnation of the SiC 20 with the molten copper is saturated, the cooling fluid is passed through the passage 80 in the lower punch 64 to cool the refractory casing 66 progressively upwardly, thus solidifying the molten copper impregnated in the SiC 20 in step S505. Until the solidification of the molten copper is completed, the space 74 in the refractory casing 66 remains pressurized by the upper punch 68 and the lower punch 64.

When the solidification of the molten copper is completed, the SiC 20 impregnated with the molten copper is removed from the refractory casing 66 in step S506.

In the method according to the third embodiment, the SiC 20 and the copper alloy 22 are heated while being sufficiently deaerated, and after the copper alloy 22 is melted while the copper alloy 22 and the SiC 20 are being held in contact with each other, the space 74 in the refractory casing 66 is pressurized and continuously held under pressure until the cooling process is completed. Therefore, the SiC 20 can efficiently be impregnated with the copper alloy 22.

If commercial pure copper is used as a metal to be impregnated in the SiC 20, then though it has a high coefficient of thermal conductivity, its wettability with respect to the SiC 20 is poor, tending to leave some open pores unimpregnated with pure copper in the SiC 20. As a result, if the conditions such as the molten metal temperature, the pressurizing time, the cooling time, etc. at the time the SiC 20 is impregnated with the pure copper are varied, the coefficient of thermal conductivity is greatly changed, resulting in large variations of the characteristics of final products that are manufactured.

According to the present embodiment, the impregnation ratio is increased by adding Be, Al, Si, Mg, Ti, Ni, or the like to copper. If the amount of the additive element is greater than 5%, then the coefficient of thermal conductivity is greatly reduced, failing to achieve the effect of the added element. Therefore, the copper alloy 22 impregnated in the SiC 20 should preferably contain up to 5% of at least one selected from Be, Al, Si, Mg, Ti, Ni, Bi, Te, Zn, Pb, Sn, and mish metal added to the copper. The copper alloy 22 may also contain unavoidable impurities and gas components such as of Ag, Cd, Zn, Au, Pd, In, Ga, Pt, Cr, Ge, Rh, Sb, Ir, Co, As, Zr, Fe, Sn, Mn, P, Pb, Nd, Ca, etc.

Of the additive elements, Be, Ti, and mish metal, for example, react with the C of the SiC 20 to form a stable carbide layer (e.g., Ti carbide) on the surface of the SiC 20, for suppressing the reaction between the SiC 20 and the Cu within the SiC 20. Therefore, each of the additive elements of Be, Ti, and mish metal has a function as a carbide generating elements.

Of the additive elements, Be, Mg, Ti, and mish metal, for example, are bonded to the oxygen of an oxide ($SiO_2$) on the surface of the SiC 20 to form a stable oxide layer (e.g., Ti oxide), for suppressing the reaction between the SiC 20 and the Cu within the SiC 20. Therefore, each of the additive elements of Be, Mg, Ti, and mish metal has a function as an oxide generating elements.

Of the additive elements, Si, Ni, Bi, Te, Zn, Pb, and Sn, for example, exhibit any one or a combination of the following effects (1) to (4), and function as a surface-active element:

(1) The above additive elements gather on the surface of the SiC 20 to suppress the reaction between the SiC 20 and the Cu.

(2) The above additive elements change the wettability between the SiC 20 and the Cu to prevent them from reacting with each other.

(3) The above additive elements change the wettability between the SiC 20 and the Cu to increase the impregnation ratio of the Cu.

(4) With a l low-melting-point metal being added, the above additive elements prevent an interfacial peel-off between the SiC 20 and the Cu after the Cu has been solidified.

Particularly, Te or a compound material containing Te is effective in increasing the coefficient of thermal conductivity.

Six experiments (first to sixth experiments will be described below. In the first experiment, a porous ceramic sintered body was made of the SiC 20, and different coefficients of thermal conductivity were observed when different metals were impregnated in the SiC 20. In the second experiment, a porous ceramic sintered body was made of AlN, and different coefficients of thermal conductivity were observed when different metals were impregnated in AlN.

Impregnating conditions in the first and second embodiments were as follows:

Molten metal temperature=1200° C.,
Immersion time=90 seconds,
Contact time (increasing pressure+holding pressure)=120 seconds, and
Cooling process: indirect water-cooled coil cooling (see step S505 shown in FIG. 17).

The immersion time represents a period of time required after the porous ceramic sintered body is immersed in the molten metal until the pressure starts to be increased. The contact time represents a period of time from the time when the molten metal is brought into direct contact with the porous ceramic sintered body, i.e., the time to start increasing the pressure, to the time to start cooling the porous ceramic sintered body.

Experimental results of the first and second embodiments are shown in FIGS. 18 and 19. It can be seen from these experimental results that the coefficient of thermal conductivity is higher when the SiC 20 is impregnated with copper alloy than when the SiC 20 is impregnated with pure copper (inventive example 11 and inventive example 21) (the coefficient of thermal conductivity is higher than the preferable value of 160 W/mK), and the coefficient of thermal conductivity suffers smaller variations when the SiC 20 is impregnated with copper alloy than when the SiC 20 is impregnated with pure copper (inventive examples 12 to 14 and inventive examples 22 to 24).

It can also be understood that the coefficient of thermal conductivity suffers smaller variations when 2.0% of an additive element with respect to copper is added (inventive examples 12, 13 and inventive examples 22, 23) than 1.5% of an additive element with respect to copper is added (inventive examples 14, 24).

In the third experiment, the SiC 20 was impregnated with pure copper (Cu), and different coefficients of thermal conductivity were observed when the SiC 20 impregnated with pure copper was cooled by different cooling processes. Impregnating conditions in the third embodiment were as follows:

Molten metal temperature=1200° C.,
Immersion time=90 seconds, and
Contact time (increasing pressure+holding pressure)=120 seconds.

Experimental results of the third embodiment are shown in FIG. 20. It can be seen from these experimental results that the coefficient of thermal conductivity is increased and suffers less variations when the SiC 20 impregnated with pure copper is cooled by a gas cooling process having a high cooling rate (inventive example 33: see step S8 in FIG. 6).

Figure 21:
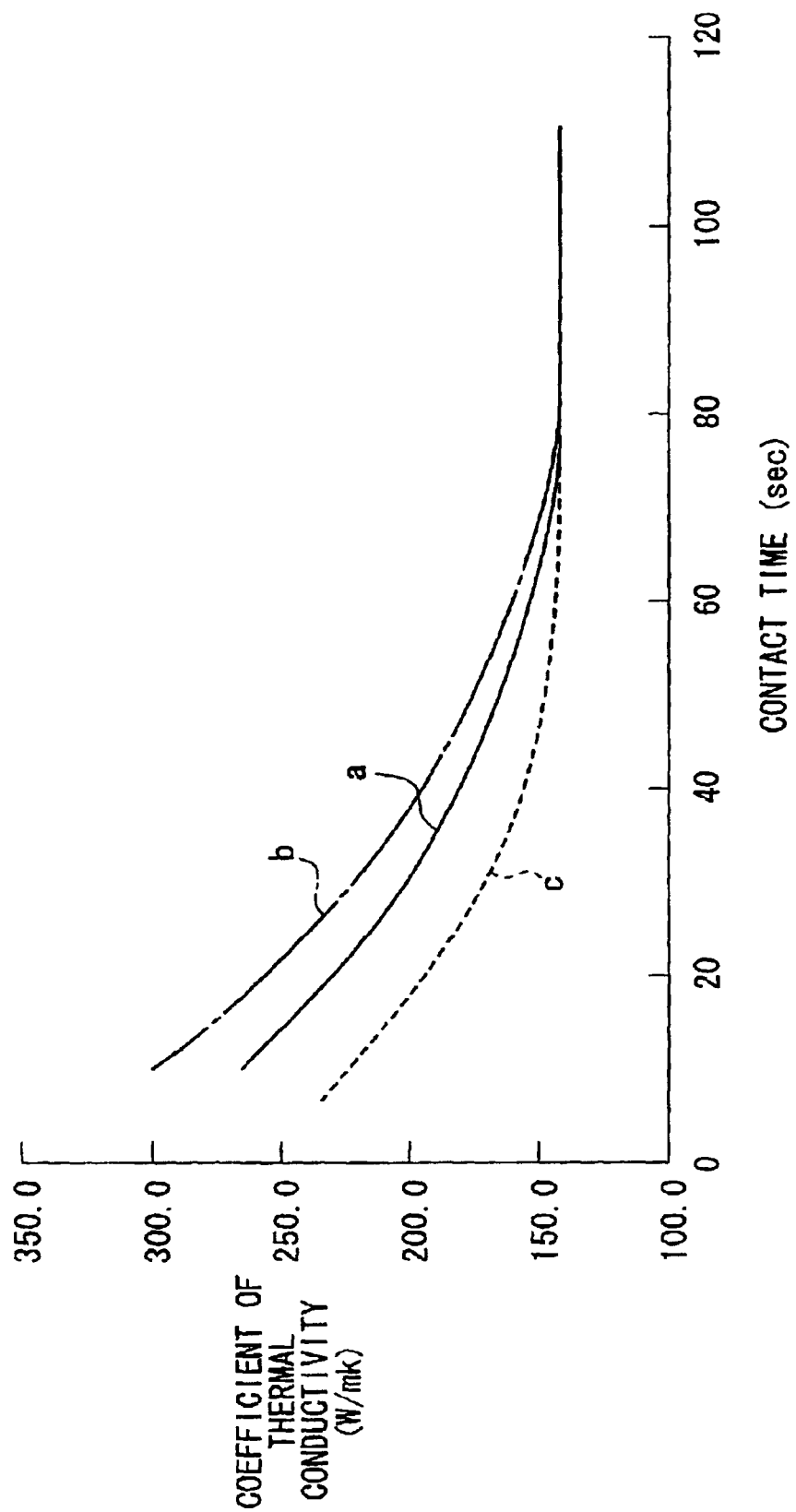
FIG. 21 is a table showing the results of a fourth experiment, indicating different coefficients of thermal conductivity for different contact times.

In the fourth experiment, changes in the coefficient of thermal conductivity with respect to the contact time were observed in the first to third experiments. Experimental results of the fourth embodiment are shown in FIG. 21. It can be seen from these experimental results that in order to keep the coefficient of thermal conductivity of 160 W/mK, the contact time of about 55 seconds or shorter is required for the molten metal at 1200° C. (see the curve a), the contact time of about 60 seconds or shorter is required for the molten metal at 1170° C. (see the curve b), and the contact time of about 35 seconds or shorter is required for the molten metal at 1240° C. (see the curve c).

The molten metal temperature should preferably be lower, but needs to be set to such a level as to prevent a failure from occurring when the SiC 20 is pulled up from the molten metal after the immersion.

In the fifth experiment, changes in the coefficient of thermal conductivity with respect to the immersion time were observed in the first to third experiments. Impregnating conditions in the fifth embodiment were as follows:

Molten metal temperature=1200° C.,
Contact time=20 seconds, and
Cooling process: Chill plate process (chill block: see step S9 in FIG. 6).

Figure 22:
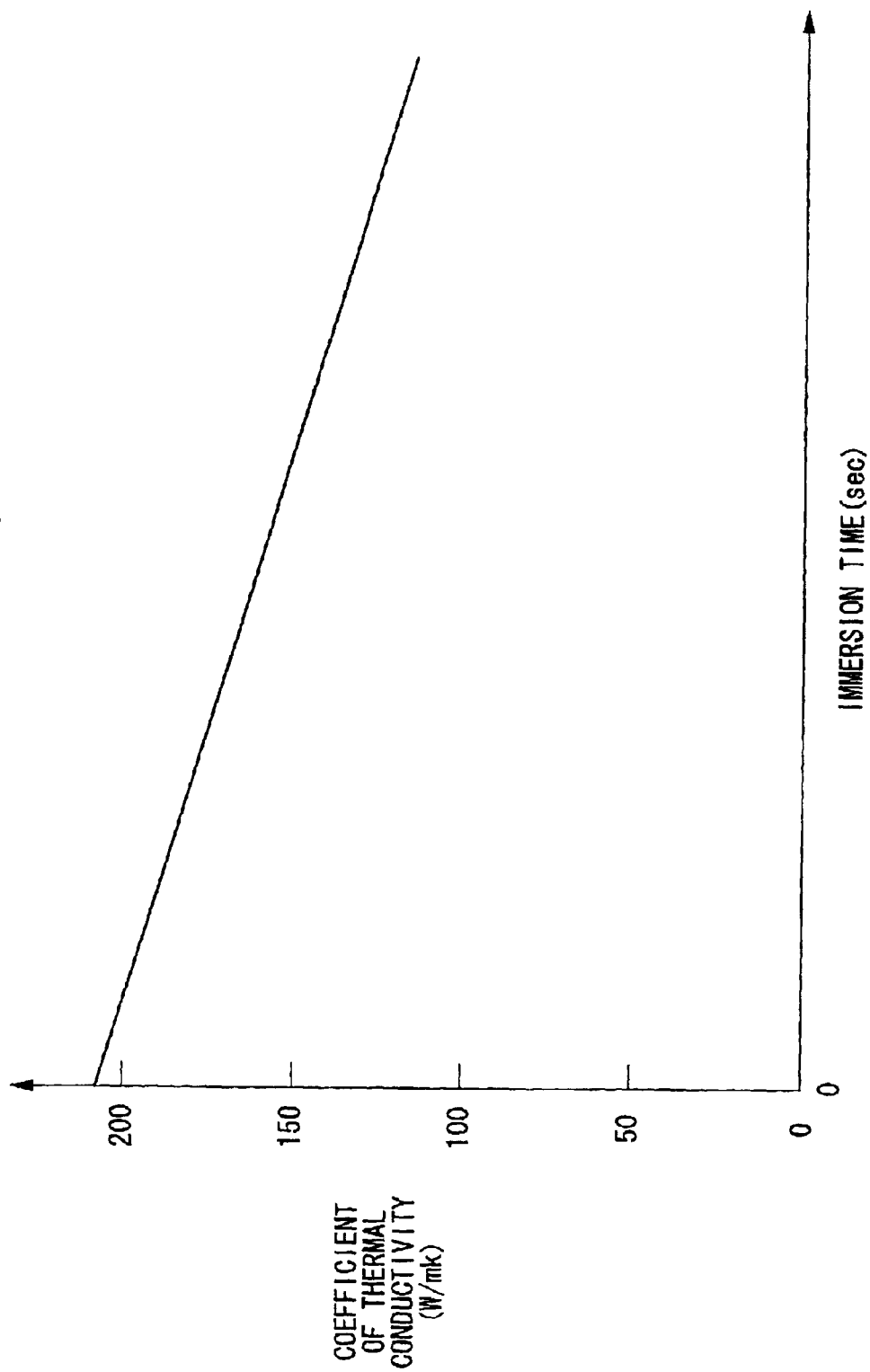
FIG. 22 is a table showing the results of a fifth experiment, indicating different coefficients of thermal conductivity for different dipping times.

Experimental results of the fifth embodiment are shown in FIG. 22. It can be seen from these experimental results that the following equation is satisfied:

$$Y = -0.3X + 210$$

where Y represents the coefficient of thermal conductivity, and X represents the immersion time. The immersion time ranges from 1 to 150 seconds.

In the sixth experiment, a porous ceramic sintered body was made of the SiC 20, and different coefficients of thermal conductivity were observed when different additive elements were added to the copper alloy 22 impregnated in the SiC 20. Experimental results of the sixth embodiment are shown in FIGS. 23A to 26. FIGS. 23A to 23C and FIG. 25 show changes in the coefficient of thermal conductivity which were caused when the additive element contained in the copper alloy impregnated in the SiC 20 with the porosity of 20 vol. % was changed. FIGS. 24A to 24C and FIG. 26 show changes in the coefficient of thermal conductivity which were caused when the additive element contained in the copper alloy impregnated in the SiC 20 with the porosity of 30 vol. % was changed.

In FIGS. 23A to 26, MM represents a mish metal, and a coefficient of thermal conductivity MAX and a coefficient of thermal conductivity min represent maximum and minimum values, respectively, of the coefficient of thermal conductivity of an alloy system regardless of the amount of an additive element added thereto. Similarly, a coefficient of thermal conductivity AVE represents an average value of the coefficient of thermal conductivity of an alloy system regardless of the amount of an additive element added thereto.

Figure 25:
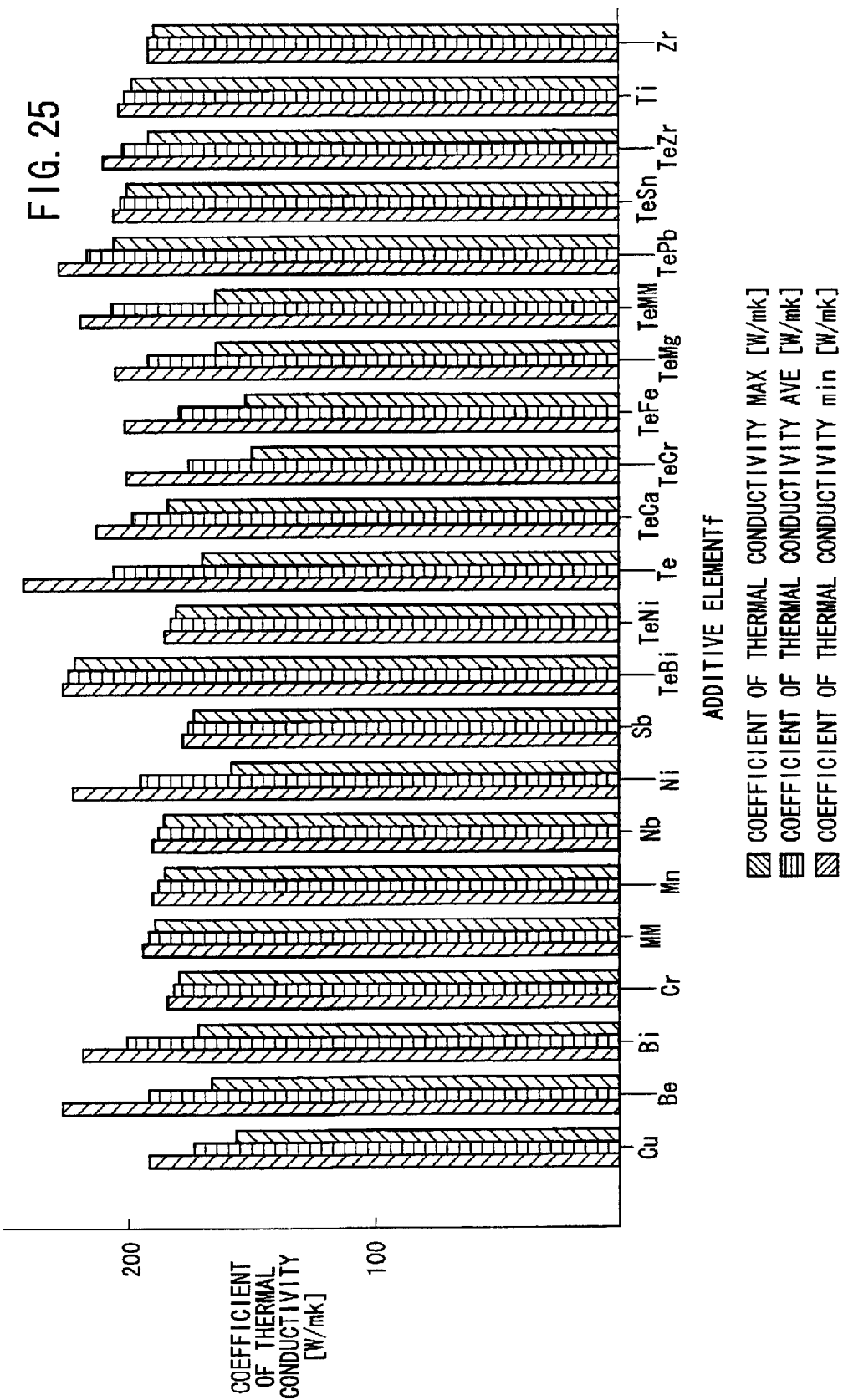
FIG. 25 is a diagram showing the results illustrated in FIGS. 23A to 23C in the form of a bar graph.
Figure 26:
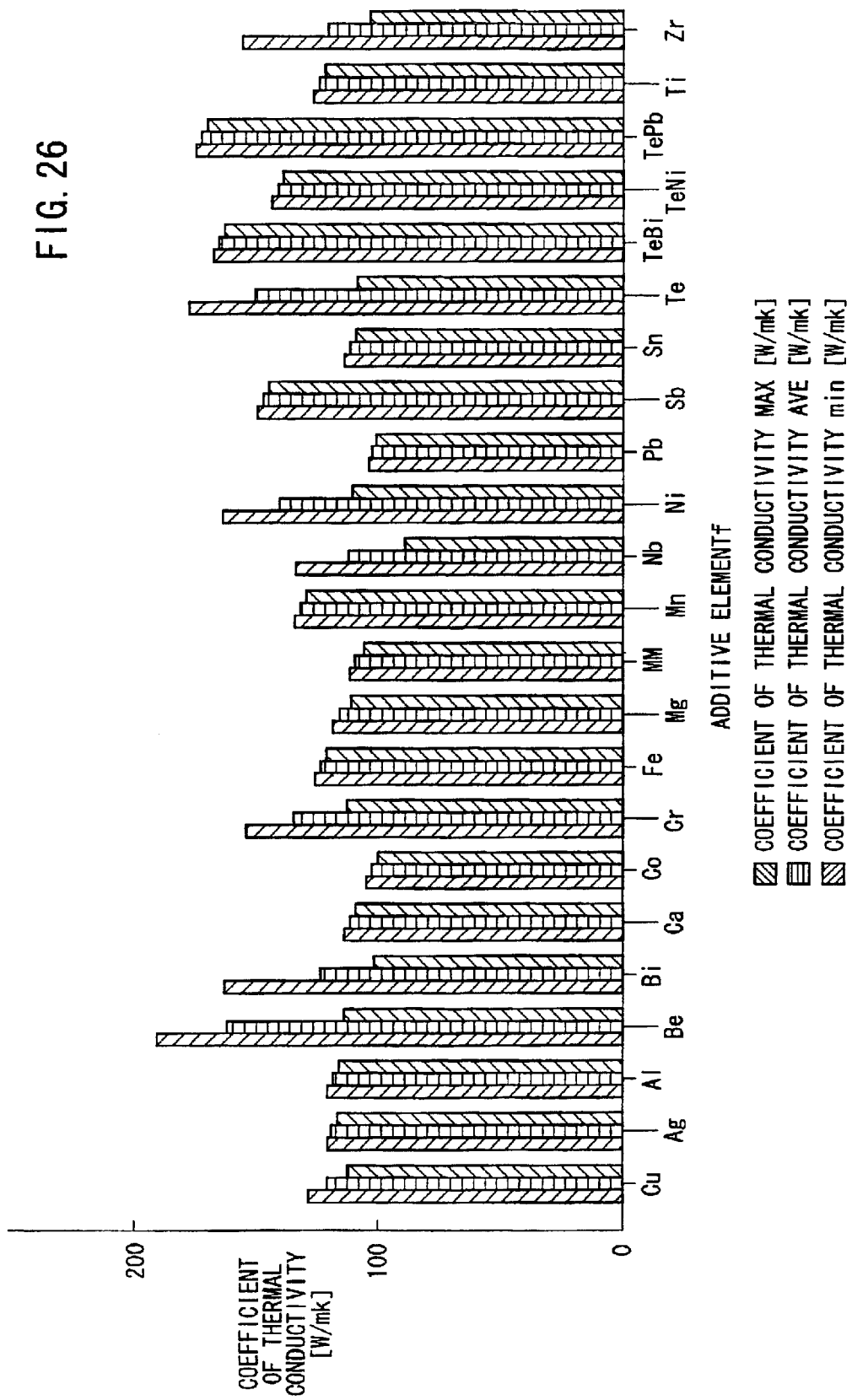
FIG. 26 is a diagram showing the results illustrated in FIGS. 24A to 24C in the form of a bar graph.

FIG. 25 shows the experimental results of the experiment on the SiC 20 with the porosity of 20 vol. % (see FIGS. 23A to 23C) in the form of a bar graph, and FIG. 26 shows the experimental results of the experiment on the SiC 20 with the porosity of 30 vol. % (see FIGS. 24A to 24C) in the form of a bar graph.

The experimental results shown in FIGS. 23A to 26 indicate that the average value of the coefficient of thermal conductivity is larger when Te or a compound material containing Te is added than when pure copper is added, and the maximum value of the coefficient of thermal conductivity is distinctly large when Te is added.

As shown in FIGS. 23A to 23C and FIG. 25, when TeBi, TeNi, TePb, TeSn, and TeZr are added to the SiC 20 with the porosity of 20 vol. %, the maximum value, minimum value, and average value of the coefficient of thermal conductivity are close to each other, and hence suffer substantially no variations.

The above fact also applies to the SiC 20 with the porosity of 30 vol. %. As shown in FIGS. 24A to 24C and FIG. 26, when TeBi, TeNi, and TePb are added to the SiC 20 with the porosity of 30 vol. %, the maximum value, minimum value, and average value of the coefficient of thermal conductivity suffer substantially no variations.

As a result, any variations of the coefficient of thermal conductivity in different lots of the composite material are substantially eliminated. Accordingly, the yield of products using the composite material according to the present embodiment is increased.

While the SiC 20 is employed as a porous ceramic sintered body which is to be impregnated, the present invention is not limited to the SiC 20, but may employ any porous ceramic sintered bodies having a flexural strength of 10 MPa or higher, e.g., AlN, $Si_3N_4$, $B_4C$, and BeO.

Figure 27:
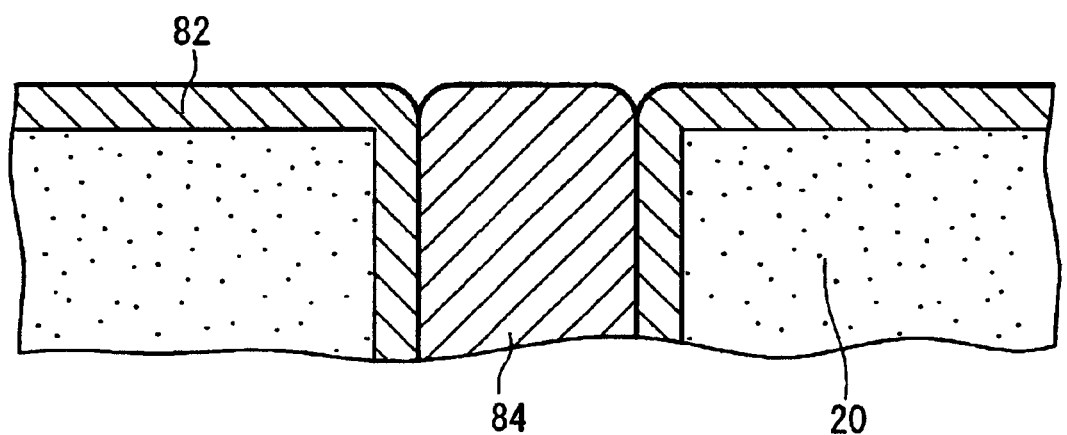
FIG. 27 is a fragmentary cross-sectional view showing a conceptual representation of a composite material according to a modification of the present invention.

FIG. 27 shows in fragmentary cross section a composite material according to a modification of the present invention. As shown in FIG. 27, the modified composite material has an oxide film 82 of an oxide ($SiO_2$) formed on the surface of the SiC 20 and impregnated with a copper alloy 84. The modified composite material can have a coefficient of thermal conductivity of 200 W/mK or higher, or preferably a coefficient of thermal conductivity of 220 W/mK or higher. The oxide film 82 is produced by a reaction between the SiC 20 and oxygen (O).

The copper alloy 84 comprises a copper containing one or more additive elements selected from one or more oxide generating elements or one or more surface-active elements. It is preferable to use, as one or more additive elements, one or more elements selected from Be, Ca, Mg, Ti, Zr, Bi, Ni, Te, and mish metal. Of these elements, Be, Ca, Mg, Ti, Zr, and mish metal are oxide generating elements which, when bonded to the oxygen (O) in the oxide film 82, fill up the interfacial gap between the oxide film 82 and the copper alloy 84 and the interfacial gap between the oxide film 82 and the copper alloy 22 shown in FIG. 1. Bi, Ni, and Te are surface-active elements for improving the wettability between the oxide film 82 and the copper to allow the oxide film 82 shown in FIG. 27 to be impregnated with the copper alloy 84 easily.

The oxide film 82 thus formed on the surface of the SiC 20 is able to suppress an interfacial reaction in the SiC 20 for thereby avoiding a reduction in the coefficient of thermal conductivity of the SiC 20. Since an oxide generating element and a surface-active element are added to the copper alloy 84, the wettability of the copper alloy 84 with respect to the oxide film 82 is improved, allowing the oxide film 82 to be impregnated with the copper alloy 84 easily. Therefore, it is possible to obtain an ideal composite material having a desired coefficient of thermal conductivity.

The composite material according to the present embodiment can be manufactured by the manufacturing methods according to the first to third embodiments with respect to the composite material shown in FIG. 1. In a method of manufacturing the modified composite material shown in FIG. 27, an oxygen atmosphere (O) is created in the refractory casing in which the SiC 20 is accommodated, and then the SiC 20 is heated to form the oxide film 82 on the surface thereof. Then, the impregnation process of the manufacturing methods according to the first to third embodiments is initiated.

The above heating step may be carried out in the cooling process of the manufacturing methods according to the first to third embodiments. Specifically, after the SiC 20 shown in FIG. 1 is impregnated with the copper alloy 22, an oxygen atmosphere (O) is created in the refractory casing in which the SiC 20 is accommodated. Then, the SiC 20 is heated, and then cooled. In these manufacturing methods, therefore, the oxide film 82 can be formed on the surface of the SiC 20 shown in FIG. 27 by the above heating step.

The thickness of the oxide film 82 varies depending on the impregnating conditions under which the oxide film 82 is impregnated with the copper alloy 84. The impregnating conditions determine the thickness of the oxide film 82 which is optimum for the suppression of the interfacial reaction. The thickness of the oxide film 82 should preferably be in the range from 0.01 $\mu$m to 10 $\mu$m. If the thickness of the oxide film 82 is too large, then the oxide film 82 acts as a thermal barrier between the SiC 20 and the copper alloy 84, tending to lower the coefficient of thermal conductivity of the composite material.

The above impregnating conditions include the molten temperature of the copper alloy 84 to be impregnated in the oxide film 82, the contact time in which the oxide film 82 contacts the copper alloy 84, the cooling process selected to cool the SiC 20 after the oxide film 82 is impregnated with the copper alloy 84, and the additive element or elements contained in the copper alloy 84 and the amount of the additive element or elements.

With the composite material according to the present invention, the process of impregnating a porous ceramic sintered body with a metal, which is generally considered difficult to perform, can easily be carried out. Furthermore, the impregnation ratio of the metal in the porous ceramic sintered body is increased, making it possible to increase the productivity of a heat sink having characteristics balanced against the coefficient of thermal expansion and the coefficient of thermal conductivity of actual electronic parts (including semiconductor devices).

With the composite material according to the present invention, an oxide film is formed on the surface of a porous ceramic sintered body, and then impregnated with a metal, thus avoiding an interfacial reaction in the porous ceramic sintered body. It is therefore possible to increase the productivity of a heat sink having characteristics balanced against the coefficient of thermal expansion and the coefficient of thermal conductivity of actual electronic parts (including semiconductor devices).

Furthermore, it is possible to increase the coefficient of thermal conductivity and reduce variations of the coefficient of thermal conductivity of the composite material, making it possible to increase the yield of products which employ the composite material.

Moreover, the composite material according to the present invention has increased lubricity and can be used as a sliding material and a bearing material.

Although certain preferred embodiments of the present invention have been shown and described in detail, it should be understood that various changes and modifications may be made therein without departing from the scope of the appended claims.

What is claimed is:

1. A composite material comprising:
    a porous ceramic sintered body produced by preliminarily sintering a porous body having a coefficient of thermal expansion lower than the coefficient of thermal expansion of copper to construct a network therein, said porous ceramic sintered body comprising a compound selected from the group consisting of SiC, AlN, $Si_3N_4$, $B_4C$, and BeO;

an oxide film formed on a surface of said porous ceramic sintered body having a thickness ranging from 0.01 μm to 10 μm; and a copper alloy impregnated in said oxide film formed on said porous ceramic sintered body, wherein said copper alloy comprises copper and one or more additive elements which are prepared to impart a coefficient of thermal conductivity of 160 W/mK or higher to said composite material.

2. A composite material according to claim 1, wherein said copper and said additive elements are prepared to impart a coefficient of thermal conductivity of 180 W/mK or higher to said composite material.

3. A composite material according to claim 1, wherein said additive elements comprise a material for increasing a solidification temperature range to 70° C. or higher and reducing a melting point when added to said copper.

4. A composite material according to claim 1, wherein said copper alloy comprises at least one additive element selected from the group consisting of carbide generating elements, oxide generating elements, and surface-active elements for up to 5% of the copper alloy.

5. A composite material according to claim 1, wherein said copper alloy comprises at least one additive element selected from the group consisting of Be, Al, Si, Mg, Ti, Ni, Bi, Te, Zn, Pb, Sn, and mish metal for up to 5% of the copper alloy.

6. A composite material according to claim 5, wherein said copper alloy comprises Be and/or Te for 0.01% to 3.0% of the copper alloy.

7. A composite material according to claim 1, wherein said composite material has an average coefficient of thermal expansion ranging from $4.0 \times 10^{-6}$/° C. to $9.0 \times 10^{-6}$/° C. at a temperature ranging from room temperature to 200° C.

8. A composite material according to claim 1, wherein said porous ceramic sintered body comprises SiC, said SiC having a porosity ranging from 10 vol. % to 70 vol. %.

* * * * *